United States Patent
Hong et al.

(10) Patent No.: US 12,014,977 B2
(45) Date of Patent: Jun. 18, 2024

(54) INTERCONNECTION STRUCTURE, METHOD OF FABRICATING THE SAME, AND SEMICONDUCTOR PACKAGE INCLUDING INTERCONNECTION STRUCTURE

(71) Applicant: Samsung Electronics Co., Ltd., Suwon-si (KR)

(72) Inventors: Ji-Seok Hong, Yongin-si (KR); Dongwoo Kim, Cheonan-si (KR); Hyunah Kim, Cheonan-si (KR); Un-Byoung Kang, Hwaseong-Si (KR); Chungsun Lee, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/199,824

(22) Filed: May 19, 2023

(65) Prior Publication Data
US 2023/0290718 A1 Sep. 14, 2023

Related U.S. Application Data

(62) Division of application No. 17/324,569, filed on May 19, 2021, now Pat. No. 11,688,679.

(30) Foreign Application Priority Data
Aug. 28, 2020 (KR) .................. 10-2020-0109118

(51) Int. Cl.
*H01L 21/00* (2006.01)
*H01L 21/48* (2006.01)
(Continued)

(52) U.S. Cl.
CPC .... *H01L 23/49838* (2013.01); *H01L 21/4857* (2013.01); *H01L 23/3128* (2013.01); *H01L 23/49816* (2013.01); *H01L 23/49822* (2013.01)

(58) Field of Classification Search
CPC .......... H01L 23/49838; H01L 21/4857; H01L 23/3128; H01L 23/49816; H01L 23/49822
See application file for complete search history.

(56) References Cited

U.S. PATENT DOCUMENTS 7,064,435 B2 6/2006 Chung et al.
7,825,022 B2 11/2010 Nalla et al.
(Continued)

FOREIGN PATENT DOCUMENTS

JP 2012074487 A 4/2012
KR 1020050006547 A 1/2005
(Continued)

*Primary Examiner* — Nicholas J Tobergte
(74) *Attorney, Agent, or Firm* — Muir Patent Law, PLLC

(57) ABSTRACT

Disclosed are interconnection structures, semiconductor packages including the same, and methods of fabricating the same. The interconnection structure comprises a first dielectric layer, a wiring pattern formed in the first dielectric layer, a portion of the wiring pattern exposed with respect to a top surface of the first dielectric layer, a second dielectric layer on the first dielectric layer, the second dielectric layer including an opening that exposes the exposed portion of the wiring pattern, a pad formed in the opening of the second dielectric layer, the pad including a base part that covers the exposed portion of the wiring pattern at a bottom of the opening and a sidewall part that extends upwardly along an inner lateral surface of the opening from the base part, a first seed layer interposed between the second dielectric layer and a first lateral surface of the sidewall part, the first seed layer being in contact with the first lateral surface and the second dielectric layer, and a second seed layer that confor- (Continued)

mally covers a second lateral surface of the sidewall part and a top surface of the base part, the second lateral surface being opposite to the first lateral surface the second dielectric layer.

20 Claims, 19 Drawing Sheets

(51) Int. Cl.
  *H01L 23/31* (2006.01)
  *H01L 23/498* (2006.01)

(56) References Cited

U.S. PATENT DOCUMENTS

| | | | |
|---|---|---|---|
| 8,461,679 B2 | 6/2013 | Lee et al. | |
| 2008/0257596 A1* | 10/2008 | Kaneko | H05K 3/4682 257/E21.511 |
| 2009/0188806 A1* | 7/2009 | Yamasaki | H05K 3/108 205/122 |
| 2014/0008816 A1* | 1/2014 | Yoda | H01L 21/76804 257/774 |
| 2016/0172300 A1* | 6/2016 | Lu | H01L 21/76885 257/786 |
| 2020/0013740 A1* | 1/2020 | Bae | H01L 24/08 |
| 2021/0210446 A1* | 7/2021 | Ho | H01L 21/4857 |
| 2021/0305188 A1* | 9/2021 | Shin | H01L 25/0652 |

FOREIGN PATENT DOCUMENTS

| | | |
|---|---|---|
| KR | 100523330 B1 | 10/2005 |
| KR | 100797694 B1 | 1/2008 |
| KR | 101443922 B1 | 9/2014 |

* cited by examiner

INTERCONNECTION STRUCTURE, METHOD OF FABRICATING THE SAME, AND SEMICONDUCTOR PACKAGE INCLUDING INTERCONNECTION STRUCTURE

CROSS-REFERENCE TO RELATED APPLICATION

This U.S. nonprovisional application is a divisional application of U.S. application Ser. No. 17/324,569 filed May 19, 2021 which claims priority under 35 U.S.C. § 119 to Korean Patent Application No. 10-2020-0109118 filed on Aug. 28, 2020 in the Korean Intellectual Property Office, the disclosure of each of these applications being hereby incorporated by reference in its entirety.

BACKGROUND

The present inventive concepts relate to an interconnection structure and a semiconductor package including the same.

Semiconductor chips are gradually becoming compact with the continuous development of semiconductor technology. In contrast, various functions are integrated into a single semiconductor chip. Therefore, semiconductor chips have a great number of input/output pads on a small area.

A semiconductor package is provided to implement an integrated circuit chip to qualify for use in electronic products. A semiconductor package is typically configured such that a semiconductor chip is mounted on a printed circuit board and bonding wires or bumps are used to electrically connect the semiconductor chip to the printed circuit board. Various studies are conducted to improve structural stability and electrical properties without pattern abnormality.

SUMMARY

Some example embodiments of the present inventive concepts provide an interconnection structure with improved structural stability and a semiconductor package including the same.

An object of the present inventive concepts is not limited to the mentioned above, and other objects which have not been mentioned above will be clearly understood to those skilled in the art from the following description.

According to some example embodiments of the present inventive concepts, an interconnection structure may comprise: a first dielectric layer; a wiring pattern formed in the first dielectric layer, a portion of the wiring pattern exposed with respect to a top surface of the first dielectric layer; a second dielectric layer on the first dielectric layer, the second dielectric layer including an opening that exposes the exposed portion of the wiring pattern; a pad formed in the opening of the second dielectric layer, the pad including a base part that covers the exposed portion of the wiring pattern at a bottom of the opening and a sidewall part that extends upwardly along an inner lateral surface of the opening from the base part; a first seed layer interposed between the second dielectric layer and a first lateral surface of the sidewall part, the first seed layer being in contact with the first lateral surface and the second dielectric layer; and a second seed layer that conformally covers a second lateral surface of the sidewall part and a top surface of the base part, the second lateral surface being opposite to the first lateral surface.

According to some example embodiments of the present inventive concepts, a semiconductor package may comprise: a redistribution substrate; a semiconductor chip mounted on the redistribution substrate; a molding layer on the redistribution substrate, the molding layer covering the semiconductor chip; and an external terminal below the redistribution substrate. The redistribution substrate may include: a first dielectric layer; a wiring pattern formed in the first dielectric layer and electrically connected to the semiconductor chip, a portion of the wiring pattern exposed with respect to a bottom surface of the first dielectric layer; a second dielectric layer formed on the first dielectric layer and including an opening that exposes the exposed portion of the wiring pattern; a pad formed in the opening of the second dielectric layer, the pad being in contact with the external terminal, the pad having a recess region that is recessed toward the first dielectric layer from a first surface of the pad opposite the first dielectric layer; and a first seed layer that conformally covers the recess region and the first surface of the pad, the first seed layer extending between the pad and the second dielectric layer.

According to some example embodiments of the present inventive concepts, a method of fabricating an interconnection structure may comprise: forming a sacrificial pattern on a carrier substrate; forming on the carrier substrate a first dielectric layer that has an opening, the sacrificial pattern being in the opening; forming on the carrier substrate a first seed layer that conformally covers the sacrificial pattern, a top surface of the first dielectric layer, and an inner lateral surface and a bottom surface of the opening; forming on the first seed layer a conductive layer that covers the first dielectric layer and fills the opening; performing on the conductive layer a planarization process to form a pad that remains in the opening and to selectively remove the first seed layer from the top surface of the first dielectric layer; forming a second dielectric layer on the passivation layer; and forming a wiring pattern that penetrates the second dielectric layer and is coupled to the pad.

DETAILED DESCRIPTION OF EMBODIMENTS

The following will now describe an interconnection structure according to the present inventive concepts with reference to accompanying drawings.

Figure 1:
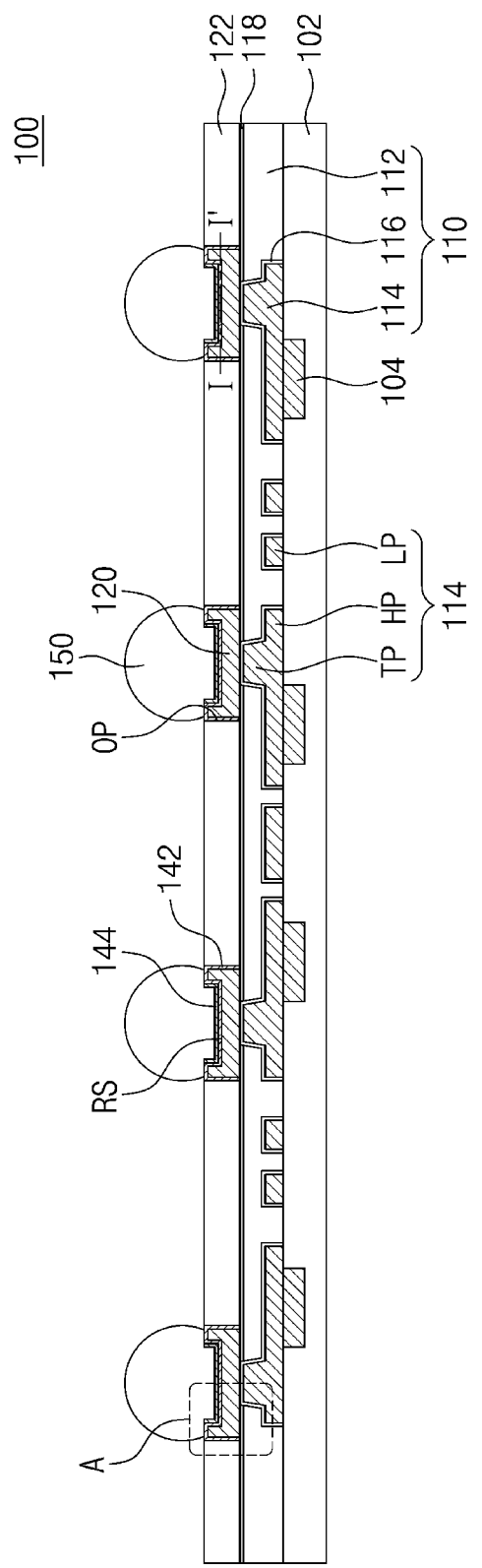
FIG. 1 illustrates a cross-sectional view showing an interconnection structure according to some example embodiments of the present inventive concepts.
Figure 2:
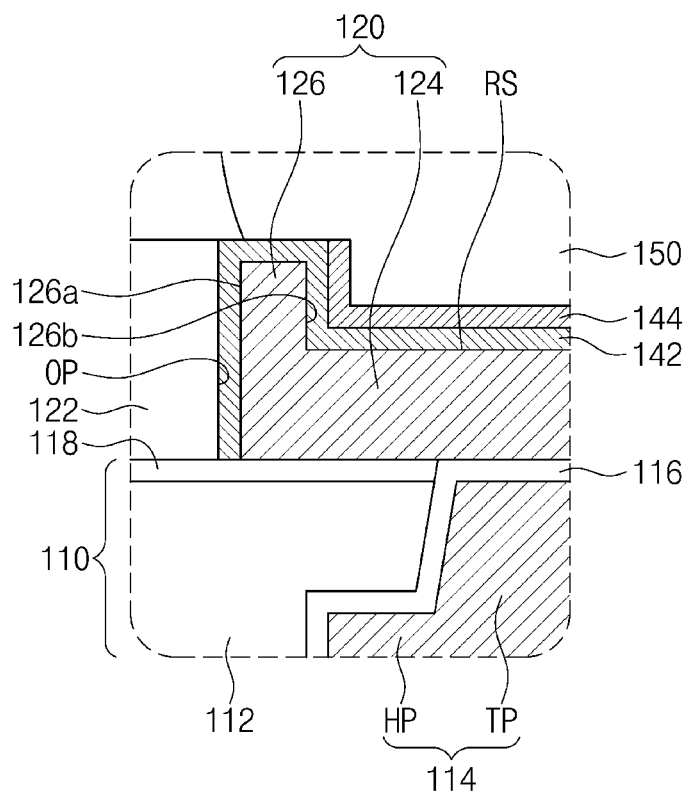
FIG. 2 illustrates an enlarged view showing section A of FIG. 1.
Figure 3:
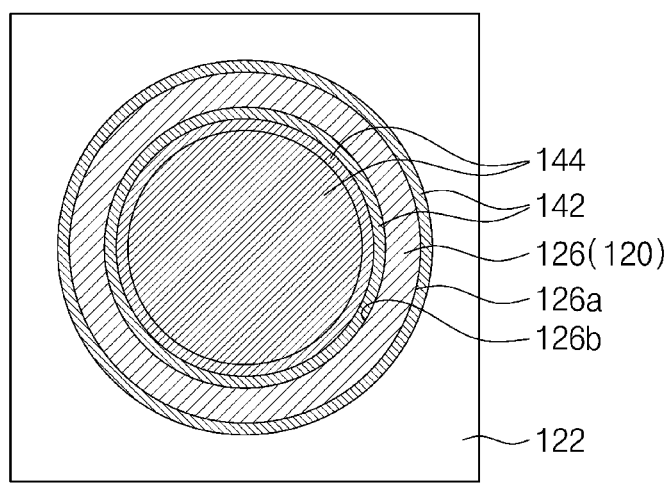
FIG. 3 illustrates a plan view showing a first seed layer and a second seed layer.

FIG. 1 illustrates a cross-sectional view showing an interconnection structure according to some example embodiments of the present inventive concepts. FIG. 2 illustrates an enlarged view showing section A of FIG. 1. FIG. 3 illustrates a plan view taken along line I-I' of FIG. 1, showing a first seed layer and a second seed layer.

Referring to FIGS. 1 to 3, an interconnection structure 100 may include at least one redistribution layer 110 and substrate pads 120 provided on the redistribution layer 110. The present embodiment will discuss that a single redistribution layer 110 is provided, but the present inventive concepts are not limited thereto. The interconnection structure 100 may include two or more redistribution layers 110 that are vertically stacked. In this description, the interconnection structure 100 may be used as an interconnection substrate, an interconnection layer, or a redistribution substrate each of which is used for a semiconductor package.

A first dielectric layer 102 may be provided. For example, the first dielectric layer 102 may include or may be formed of a dielectric and/or photosensitive polymer. The first dielectric layer 102 may have, on its upper portion, internal pads 104 electrically connected to the redistribution layer 110 which will be discussed below. The internal pads 104 may be buried in the first dielectric layer 102. The internal pads 104 may be exposed on a top surface of the first dielectric layer 102. The internal pads 104 may correspond to redistribution circuits or internal circuits of a redistribution substrate to which the interconnection structure 100 is applied. Alternatively, the internal pads 104 may correspond to pads of a redistribution substrate to which the interconnection structure 100 is applied and on which a semiconductor device or an electronic device is mounted.

In certain embodiments, a first passivation layer may be provided on the first dielectric layer 102. The first passivation layer may cover the top surface of the first dielectric layer 102. In this case, the internal pads 104 may penetrate the first passivation layer and may be exposed on a top surface of the first passivation layer.

Spatially relative terms, such as "top," "bottom," "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features as is the same in various embodiments in the present disclosure. Thus, the term "below" can encompass both an orientation of above and below. The device may be otherwise oriented (rotated 90 degrees or at other orientations) and the spatially relative descriptors used herein interpreted accordingly.

The redistribution layer 110 may be provided on the first dielectric layer 102. The redistribution layer 110 may include a second dielectric layer 112 and one or more first wiring patterns 114 in the second dielectric layer 112.

The second dielectric layer 112 may be disposed on the first dielectric layer 102. The second dielectric layer 112 may include or may be formed of a photosensitive polymer or a photo-imageable dielectric (PID). For example, the photosensitive polymer may include one or more of photosensitive polyimide, polybenzoxazole (PBO), phenolic polymers, and benzocyclobutene polymers.

The first wiring patterns 114 may be provided in the second dielectric layer 112. Each of the first wiring patterns 114 may have a damascene structure. For example, the first wiring pattern 114 may have a line part LP, and may also have a head part HP and a tail part TP that are integrally formed into a single body. For example, the head part HP may correspond to or may be a pad part that is provided on a lower portion of the second dielectric layer 112 and is coupled to the internal pad 104, and the tail part TP may correspond to or may be a via part that penetrates the second dielectric layer 112 and has connection with the head part HP. The head part HP and the tail part TP may vertically overlap each other, and the tail part TP may extend from the head part HP onto a top surface of the second dielectric layer 112. The head part HP may have a width, e.g., in a horizontal direction, greater than that of the tail part TP. The line part LP may have a linear shape. The line part LP and the head part HP may be connected (e.g., integrally formed) to constitute an electrical circuit of the redistribution layer 110. The first wiring pattern 114 may include or may be formed of a conductive material. For example, the first wiring pattern 114 may include or may be formed of copper (Cu).

A first barrier layer 116 may be formed to surround the first wiring pattern 114. The first barrier layer 116 may be interposed between the second dielectric layer 112 and the first wiring pattern 114. The first barrier layer 116 may surround lateral and top surfaces of the first wiring pattern 114. The first barrier layer 116 may have a thickness of about 50 Å to about 1,000 Å. The first barrier layer 116 may include or may be formed of titanium (Ti), tantalum (Ta), titanium nitride (TiN), or tantalum nitride (TaN).

A first passivation layer 118 may be provided on the second dielectric layer 112. The first passivation layer 118 may cover the top surface of the second dielectric layer 112. The tail part TP of the first wiring pattern 114 may penetrate the first passivation layer 118. Therefore, the first wiring pattern 114 may be exposed on a top surface of the first passivation layer 118.

A third dielectric layer 122 may be provided on the first passivation layer 118. The third dielectric layer 122 may cover the top surface of the first passivation layer 118. The third dielectric layer 122 may have openings OP. The openings OP may vertically penetrate the third dielectric layer 122, e.g., from a bottom to a top. The openings OP may expose the first wiring patterns 114. For example, portions of the wiring patterns 114 formed in the second dielectric layer 112 may be exposed with respect to a top surface of the second dielectric layer 112, and the openings OP may expose the exposed portion of the wiring pattern 114. As shown in FIG. 3, the openings OP may have their circular shapes when viewed in a plan view. The present inventive concepts, however, are not limited thereto, and in certain embodiments, the openings OP may have their polygonal, oval, or linear shapes when viewed in a plan view. The third dielectric layer 122 may include or may be formed of a photosensitive polymer or a photo-imageable dielectric (PID). For example, the photosensitive polymer may include one or more of photosensitive polyimide, polybenzoxazole (PBO), phenolic polymers, and benzocyclobutene polymers. The third dielectric layer 122 may protect the redistribution layer 110, e.g., from physical and/or chemical damages including contaminations.

The third dielectric layer 122 may have substrate pads 120 therein. The substrate pads 120 may be disposed in the openings OP of the third dielectric layer 122. The substrate pads 120 may have U shapes at their cross-sections taken in a direction perpendicular to the top surface of the first dielectric layer 102. For example, the substrate pads 120 may have their shapes that extend along inner lateral and bottom surfaces of the openings OP. Each of the substrate pads 120 may have a base part 124 positioned on the bottom surface of the opening OP and a sidewall part 126 that extends in a direction perpendicular to the top surface of the first dielectric layer 102 and along the inner lateral surface of the opening OP. The sidewall part 126 may have a first lateral surface 126a directed toward the inner lateral surface of the opening OP and a second lateral surface 126b opposite to the first lateral surface 126a. The sidewall part 126 may have a width, defined as a width between the first and second lateral surfaces 126a and 126b, e.g., in a horizontal direction, which is about 5% to about 20% of a width of the opening OP. When viewed in a plan view, a closed curved shape may be given to the sidewall part 126 that extends along the inner lateral surface of the opening OP. For example, the sidewall part 126 may have a ring shape. Therefore, an empty space may be formed on the base part 124 and inside the sidewall part 126. For example, the substrate pads 120 may fill the openings OP, and may be provided on their top surfaces with recess regions RS that are recessed toward the first dielectric layer 102 from the top surfaces of the substrate pads 120. The recess region RS may have a width about 80% to about 95% of that of the opening OP, e.g., in a horizontal direction. The substrate pad 120 may have a thickness of about 1 μm to about 10 μm, or a thickness of the base part 124 and a thickness of the sidewall part 126. The thickness of the base part 124 may correspond to a thickness in a direction perpendicular to a top surface of the base part 124, and the thickness of the sidewall part 126 may correspond to a thickness in a direction perpendicular to the first lateral surface 126a of the sidewall part 126. The substrate pads 120 may include or may be formed of a conductive material. For example, the substrate pads 120 may include or may be formed of copper (Cu).

A first seed layer 142 may be interposed between the substrate pad 120 and the third dielectric layer 122. For example, the first seed layer 142 may be provided on the first lateral surface 126a of the sidewall part 126 included in the substrate pad 120. The first seed layer 142 may be in contact with the inner lateral surface of the opening OP formed in the third dielectric layer 122 and with the first lateral surface 126a of the substrate pad 120. The first seed layer 142 may separate the substrate pad 120 from the third dielectric layer 122. The first seed layer 142 may extend into the recess region RS. For example, the first seed layer 142 may extend onto a top surface of the sidewall part 126, the second lateral surface 126b of the sidewall part 126, and the top surface of the base part 124. In this case, the first seed layer 142 may conformally cover an outer lateral surface (or the first lateral surface 126a), the top surface, and an inner lateral surface of the substrate pad 120. The first seed layer 142 may have an uppermost surface coplanar with a top surface of the third dielectric layer 122. The first seed layer 142 may have a thickness of about 0.1 μm to about 1 μm. The first seed layer 142 may include or may be formed of titanium (Ti), titanium nitride (TiN), tantalum (Ta), tantalum nitride (TaN), nickel (Ni), or tungsten nitride (TW). The first seed layer 142 may block oxygen from being introduced to the substrate pad 120 from the third dielectric layer 122 and/or from outside, and may prevent the substrate pad 120 from being corroded. For example, the first seed layer 142 may include a metallic material whose ionization tendency is greater than an ionization tendency of a metallic material included in the substrate pad 120.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

A second seed layer 144 may be provided on the substrate pad 120. In the recess region RS, the second seed layer 144 be formed to conformally cover the top surface of the base part 124 included in the substrate pad 120 and the second lateral surface 126b of the sidewall part 126 included in the substrate pad 120. For example, the first seed layer 142 and the second seed layer 144 may be sequentially stacked on the base part 124. In this case, the recess region RS may have therein the first seed layer 142 interposed between the substrate pad 120 and the second seed layer 144. For example, the first seed layer 142 may extend along a top surface of the sidewall part 126 and between the substrate pad 120 and the second seed layer 144. The second seed layer 144 may have an uppermost end at the same level as that of the top surface of the third dielectric layer 122 and that of the uppermost surface of the first seed layer 142. The second seed layer 144 may have a U-shaped cross-section that conformally covers an inner sidewall and a bottom surface of the recess region RS. The second seed layer 144 may have a thickness of about 0.1 μm to about 1 μm. The second seed layer 144 may include or may be formed of a metallic material that has a high wettability with an external terminal 150 which will be discussed below. For example, the second seed layer 144 may include or may be formed of copper (Cu), ruthenium (Ru), nickel (Ni), titanium (Ti), or tungsten (W).

In certain embodiments, the first seed layer 142 and the second seed layer 144 may be integrally formed, e.g., in the same process, so that the first seed layer 142 and the second seed layer 144 forms one body. In this case, the integrally formed seed layer may be thicker on the recess region RS than on the top surface of the sidewall part 126. In certain embodiments, the integrally formed seed layer may have substantially the same thickness on the recess region RS and on the top surface of the side wall part 126.

In certain embodiments, a third seed layer may be formed between the first seed layer 142 and the second seed layer 144. The third seed layer may be formed of the same material as one of the first and second seed layers 142 and 144. In certain embodiments, the third seed layer may be formed of a different material than the first and second seed layers 142 and 144.

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The substrate pads 120 may be provided thereon with external terminals 150. Each of the external terminals 150 may be in contact with a corresponding second seed layer 144. For example, each of the external terminals 150 may fill a remaining portion of the recess regions RS of the substrate pads 120. For example, the recess regions RS may be filled with the first seed layers 142, the second seed layers 144 and/or the external terminals 150.

According to some example embodiments of the present inventive concepts, as the substrate pad 120 has a U-shaped cross-section, an increased contact area and a high adhesive force may be provided between the second seed layer 144 and the external terminal 150. In addition, as the substrate pad 120 is provided thereon with the second seed layer 144 having a high wettability with the external terminal 150, the external terminal 150 may be rigidly attached to the substrate pad 120. Accordingly, the interconnection structure 100 may be provided to have increased structural stability. For example, the second seed layer 144 may have a wettability higher than the first seed layer 142 with respect to the external terminal 150. For example, the external terminal 150 may be a solder ball.

Figure 4:
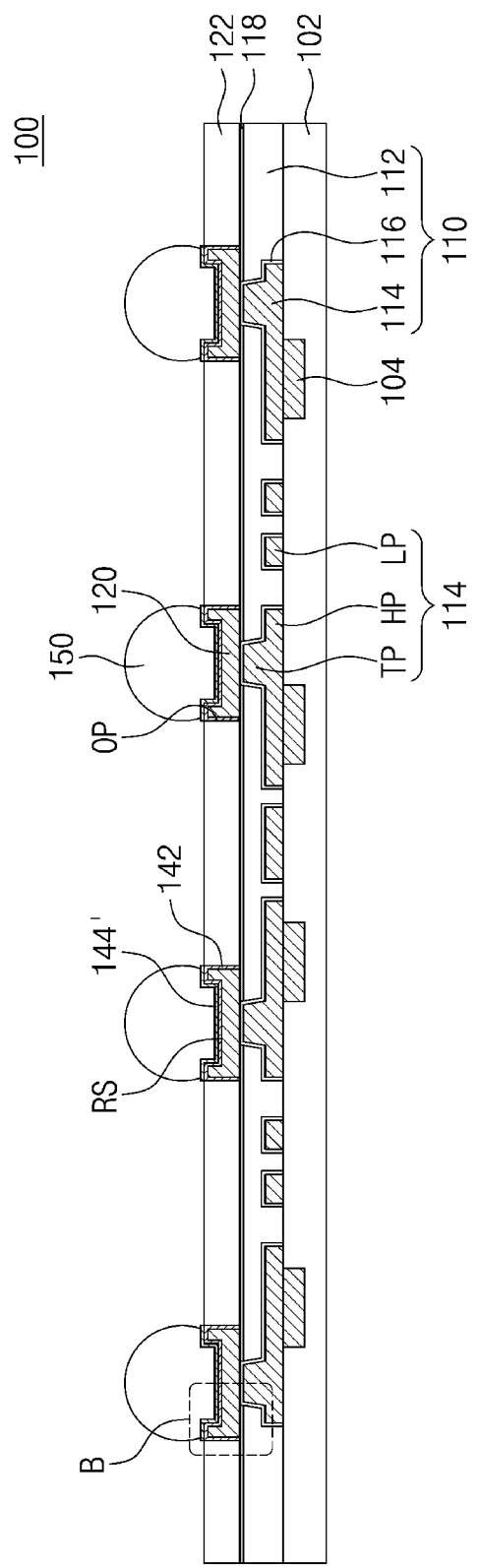
FIG. 4 illustrates a cross-sectional view showing an interconnection structure according to some example embodiments of the present inventive concepts.
Figure 5:
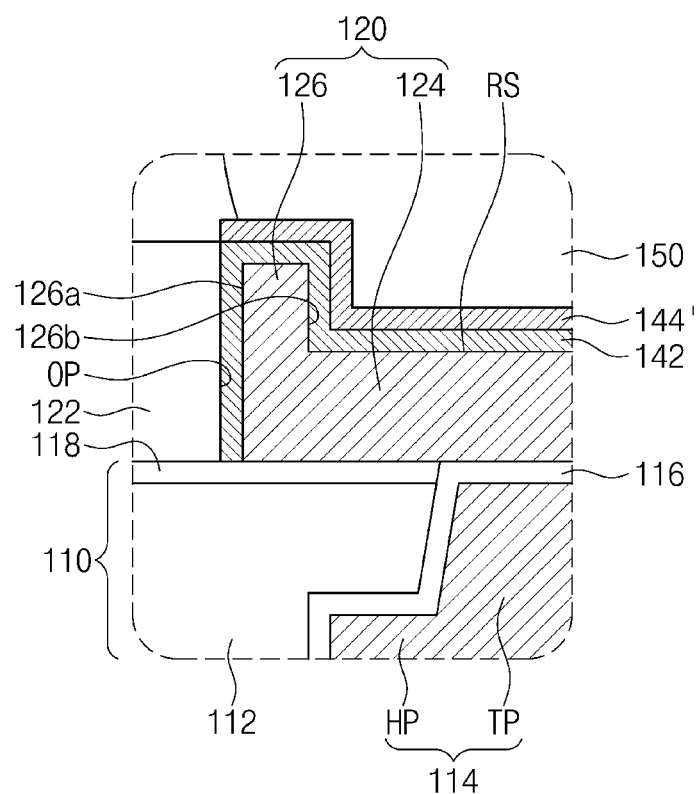
FIG. 5 illustrates an enlarged view showing section B of FIG. 4.

According to some example embodiments, a second seed layer 144' may extend onto the sidewall part 126 of the substrate pad 120. FIG. 4 illustrates a cross-sectional view showing an interconnection structure 100 according to some example embodiments of the present inventive concepts. FIG. 5 illustrates an enlarged view showing section B of FIG. 4. As shown in FIGS. 4 and 5, the second seed layer 144' may extend from the second lateral surface 126b of the sidewall part 126 onto the top surface of the sidewall part 126. For example, the first seed layer 142 and the second seed layer 144' may be sequentially stacked on the top surface of the base part 124. As the second seed layer 144' extends onto the sidewall part 126 of the substrate pad 120, the second seed layer 144' may have an uppermost surface at a higher level than that of the top surface of the third dielectric layer 122. On the sidewall part 126, the second seed layer 144' may have an end on the same plane on which a contact surface is provided between the third dielectric layer 122 and the first seed layer 142.

The substrate pads 120 may be provided thereon with external terminals 150. The external terminal 150 may be in contact with the second seed layer 144'. For example, the external terminal 150 may fill a remaining portion of the recess region RS, e.g., after filled with the first seed layer 142 and/or the second seed layer 144'.

According to some example embodiments of the present inventive concepts, the second seed layer 144' may be provided to completely cover the top surface of the substrate pad 120, and the external terminal 150 may be in contact with only the second seed layer 144'. For example, the external terminal 150 may be in contact with only a single material layer (e.g., in this example, with only the second seed layer 144'). Therefore, adhesion stress may be reduced between the substrate pad 120 and the external terminal 150. For example, adhesion stress may be increased when one pattern is attached with two or more different patterns formed of different materials. For example, an adhesion stress may be caused by differences of adhesion forces and/or expansion rates produced when the external terminal 150 is in contact with a plurality of material layers/patterns together. Accordingly, the present embodiment may be beneficial to provide an interconnection structure with improved structural stability.

Figure 6:
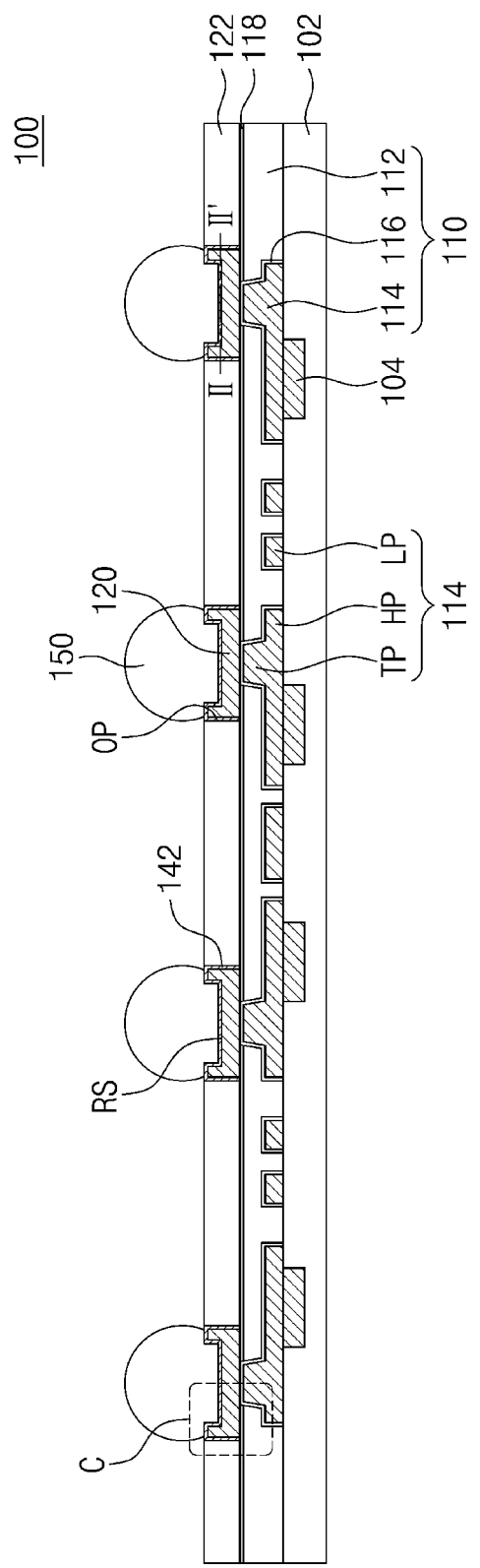
FIG. 6 illustrates a cross-sectional view showing an interconnection structure according to some example embodiments of the present inventive concepts.
Figure 7:
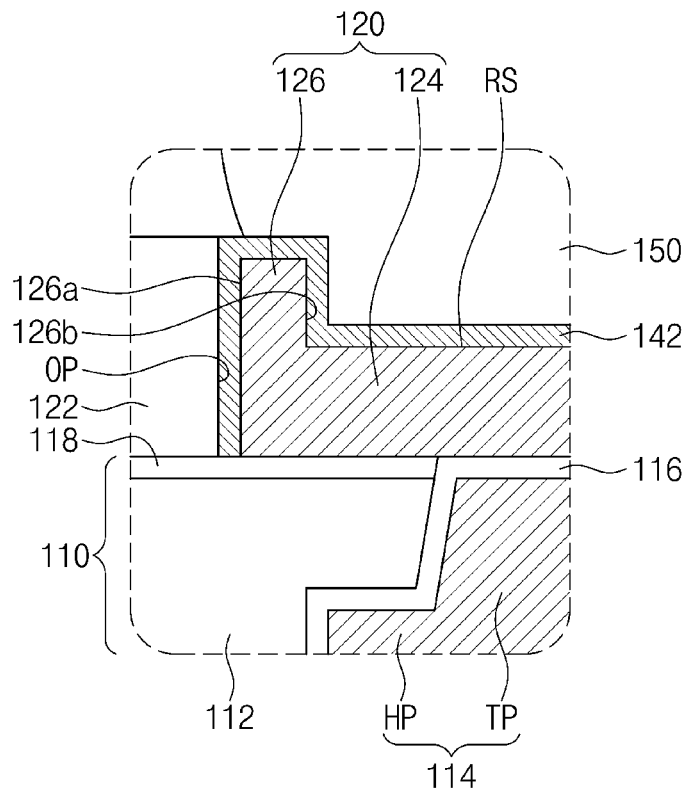
FIG. 7 illustrates an enlarged view showing section C of FIG. 6.
Figure 8:
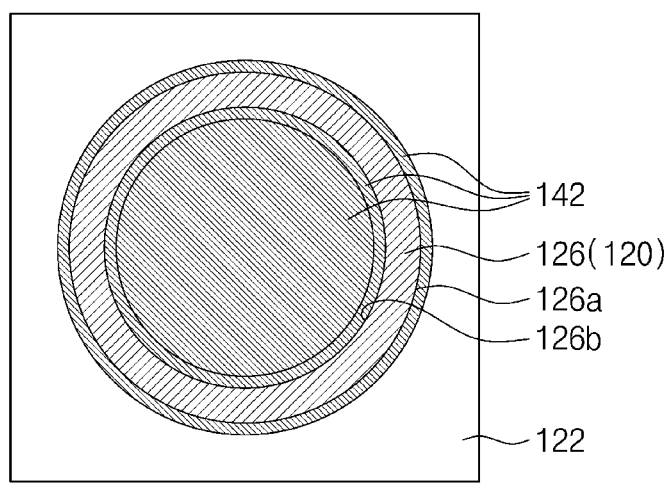
FIG. 8 illustrates a plan view showing a first seed layer and a second seed layer.

FIG. 6 illustrates a cross-sectional view showing an interconnection structure 100 according to some example embodiments of the present inventive concepts. FIG. 7 illustrates an enlarged view showing section C of FIG. 6. FIG. 8 illustrates a cross-sectional view taken along line II-II' of FIG. 6, showing a first seed layer and a second seed layer. In the embodiment that follows, a detailed description of technical features repetitive to those discussed with reference to FIGS. 1 to 5 will be omitted, and a difference thereof will be discussed in detail. The same components as those of the interconnection structure 100 discussed above will be allocated the same reference numerals thereto.

Referring to FIGS. 6 to 8, the first seed layer 142 may be interposed between the substrate pad 120 and the third dielectric layer 122. For example, the first seed layer 142 may be provided on the first lateral surface 126a of the sidewall part 126 included in the substrate pad 120. The first seed layer 142 may be in contact with the inner lateral surface of the opening OP in the third dielectric layer 122 and with the first lateral surface 126a of the substrate pad 120. The first seed layer 142 may separate the substrate pad 120 from the third dielectric layer 122. The first seed layer 142 may extend into the recess region RS. For example, the first seed layer 142 may extend onto a top surface of the sidewall part 126, the second lateral surface 126b of the sidewall part 126, and the top surface of the base part 124. In this case, the first seed layer 142 may conformally cover an outer lateral surface (or the first lateral surface 126a), the top surface, and an inner lateral surface of the substrate pad 120. The first seed layer 142 may have an uppermost surface coplanar with a top surface of the third dielectric layer 122. The first seed layer 142 may have a thickness of about 0.1 μm to about 1 μm. The first seed layer 142 may block oxygen from being introduced to the substrate pad 120 from the third dielectric layer 122 and/or from outside, and may prevent the substrate pad 120 from being corroded. The first seed layer 142 may include or may be formed of a metallic material that has a high wettability with an external terminal 150. For example, the first seed layer 142 may include or may be formed of ruthenium (Ru), nickel (Ni), titanium (Ti), or tungsten (W).

The second seed layer (see 144 of FIG. 1) may not be provided in the present embodiment.

The substrate pads 120 may be provided thereon with external terminals 150. The external terminal 150 may be in contact with the first seed layer 142. For example, the external terminal 150 may fill a remaining portion of the recess region RS of the substrate pads 120.

According to some example embodiments of the present inventive concepts, as the substrate pad 120 has a U-shaped cross-section, an increased contact area and a high adhesive force may be provided between the first seed layer 142 and the external terminal 150. For example, as the substrate pad 120 is provided thereon with the first seed layer 142 having a high wettability with the external terminal 150, the external terminal 150 may be rigidly attached to the substrate pad 120. Accordingly, the shape of the substrate pad 120 may be beneficial to provide an interconnection structure with improved structural stability.

Figure 9:
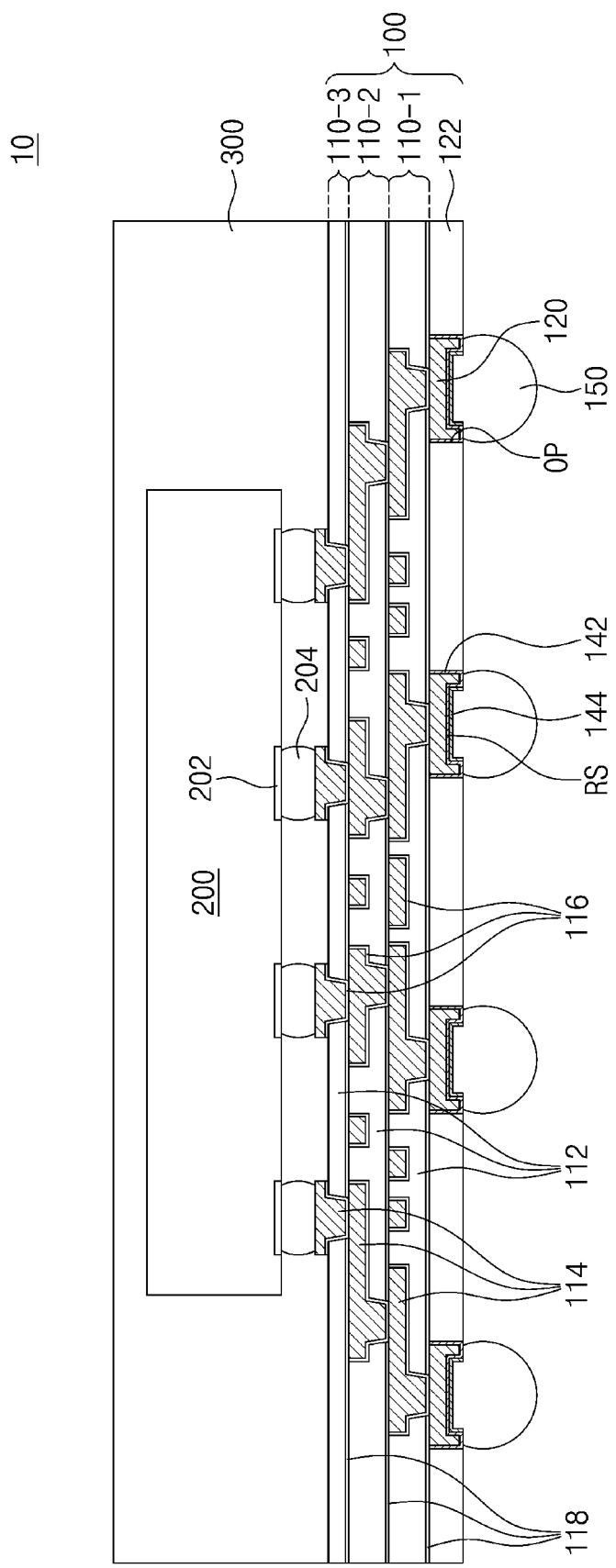
FIGS. 9 to 12 illustrate cross-sectional views showing a semiconductor package according to some example embodiments of the present inventive concepts.

FIG. 9 illustrates a cross-sectional view showing a semiconductor package according to some example embodiments of the present inventive concepts.

Referring to FIG. 9, a semiconductor package 10 may include a lower redistribution substrate 100, a first semiconductor chip 200, and a first molding member 300.

The lower redistribution substrate 100 may be the same as or similar to any one of the interconnection structures discussed with reference to FIGS. 1 to 8.

The lower redistribution substrate 100 may include redistribution layers 110-1, 110-2, and 110-3 and substrate pads 120 provided below the redistribution layers 110-1, 110-2, and 110-3.

Each of the redistribution layers 110-1, 110-2, and 110-3 may correspond to the redistribution layer 110 discussed with reference to FIG. 1. For example, each of the redistribution layers 110-1, 110-2, and 110-3 may include a lower dielectric layer 112 and a lower wiring pattern 114 in the lower dielectric layer 112. The lower dielectric layer 112 may include or may be formed of a photosensitive polymer or a photo-imageable dielectric (PID). The lower wiring pattern 114 may be provided in the lower dielectric layer 112. The lower wiring pattern 114 may have a damascene structure. Each of the redistribution layers 110-1, 110-2, and 110-3 may have a lower barrier layer 116 that covers lateral and bottom surfaces of the lower wiring pattern 114. Each of the redistribution layers 110-1, 110-2, and 110-3 may have a lower passivation layer 118 that covers a bottom surface of the lower dielectric layer 112. The lower passivation layer 118 may cover an entirety of the bottom surface of the lower dielectric layer 112 and may expose the lower wiring pattern 114. FIG. 9 depicts the lower redistribution substrate 100 having three redistribution layers 110-1, 110-2, and 110-3, but the present inventive concepts are not limited thereto. The lower redistribution substrate 100 may have various numbers of redistribution layers in certain embodiments. When a first layer or pattern covers a bottom surface of a second layer or pattern, the covering configuration may include an arrangement that the first layer or pattern vertically overlaps the second layer or pattern in which the first layer or pattern is positioned below the second layer or pattern.

On an uppermost redistribution layer 110-3, the lower wiring pattern 114 may be exposed on a top surface of the lower dielectric layer 112, and may correspond to a pad of the lower redistribution substrate 100 on which a semiconductor or electronic device is mounted.

A substrate pad dielectric layer 122 may be provided on a bottom surface of a lowermost redistribution layer 110-1. The substrate pad dielectric layer 122 may cover the lower dielectric layer 112 of the lowermost redistribution layer 110-1. The substrate pad dielectric layer 122 may have openings. The openings may vertically penetrate the substrate pad dielectric layer 122, and may each expose the lower wiring pattern 114 of the lowermost redistribution layer 110-1. The substrate pad dielectric layer 122 may include or may be formed of a photosensitive polymer or a photo-imageable dielectric (PID).

The substrate pad dielectric layer 122 may have substrate pads 120 therein. The substrate pads 120 may be disposed in the openings of the substrate pad dielectric layer 122. The substrate pads 120 may have their shapes that extend along inner lateral and bottom surfaces of the openings. For example, the substrate pads 120 may fill the openings, and may be provided on their bottom surfaces with recess regions that are recessed toward the redistribution layers 110-1, 110-2, and 110-3 from the bottom surfaces of the substrate pads 120. The substrate pads 120 may include or may be formed of a conductive material. For example, the substrate pads 120 may include or may be formed of copper (Cu).

A first seed layer 142 may be interposed between the substrate pad 120 and the substrate pad dielectric layer 122. For example, the first seed layer 142 may be in contact with the inner lateral surface of the opening formed in the substrate pad dielectric layer 122 and with an outer lateral surface of the substrate pad 120. The first seed layer 142 may separate the substrate pad 120 from the substrate pad dielectric layer 122. The first seed layer 142 may extend into the recess region. For example, the first seed layer 142 may conformally cover the outer lateral surface, the bottom surface, and an inner lateral surface of the substrate pad 120. The first seed layer 142 may have a lowermost surface coplanar with a bottom surface of the substrate pad dielectric layer 122. The first seed layer 142 may include or may be formed of titanium (Ti), titanium nitride (TiN), tantalum (Ta), tantalum nitride (TaN), nickel (Ni), or tungsten nitride (TW).

A second seed layer 144 may be provided on the substrate pad 120. In the recess region, the second seed layer 144 may be formed to conformally cover the inner lateral surface and the bottom surface of the substrate pad 120. For example, the first seed layer 142 and the second seed layer 144 may be sequentially stacked in the recess region. The second seed layer 144 may have a reverse U-shaped cross-section that conformally covers an inner lateral surface and a bottom surface of the recess region. The second seed layer 144 may include or may be formed of a metallic material that has a high wettability with an external terminal 150 which will be discussed below. For example, the second seed layer 144 may include or may be formed of copper (Cu), ruthenium (Ru), nickel (Ni), titanium (Ti), or tungsten (W).

The substrate pads 120 may be provided thereon with external terminals 150. The external terminal 150 may be in contact with the second seed layer 144. For example, the external terminal 150 may fill a remaining portion of the recess region.

The first semiconductor chip 200 may be mounted on the lower redistribution substrate 100. The first semiconductor chip 200 may be flip-chip mounted on the lower redistribution substrate 100. For example, the first semiconductor chip 200 may include chip pads 202 electrically connected to integrated circuits of the first semiconductor chip 200. Connection terminals 204 may be provided between the chip pads 202 and the lower wiring patterns 114 of the uppermost redistribution layer 110-3. The chip pads 202 may be electrically connected through the connection terminals 204 to the lower wiring patterns 114 of the uppermost redistribution layer 110-3. The first semiconductor chip 200 may be, for example, a logic chip. Although not shown, an under-fill member may fill a space between the first semiconductor chip 200 and the lower redistribution substrate 100. Between the first semiconductor chip 200 and the lower redistribution substrate 100, the under-fill member may surround the connection terminals 204, the chip pads 202, and the lower wiring pattern 114 of the uppermost redistribution layer 110-3.

A molding member 300 may be provided on the lower redistribution substrate 100. The molding member 300 may cover the first semiconductor chip 200. The molding member 300 may include or may be formed of a dielectric material, such as an epoxy molding compound (EMC).

Figure 10:
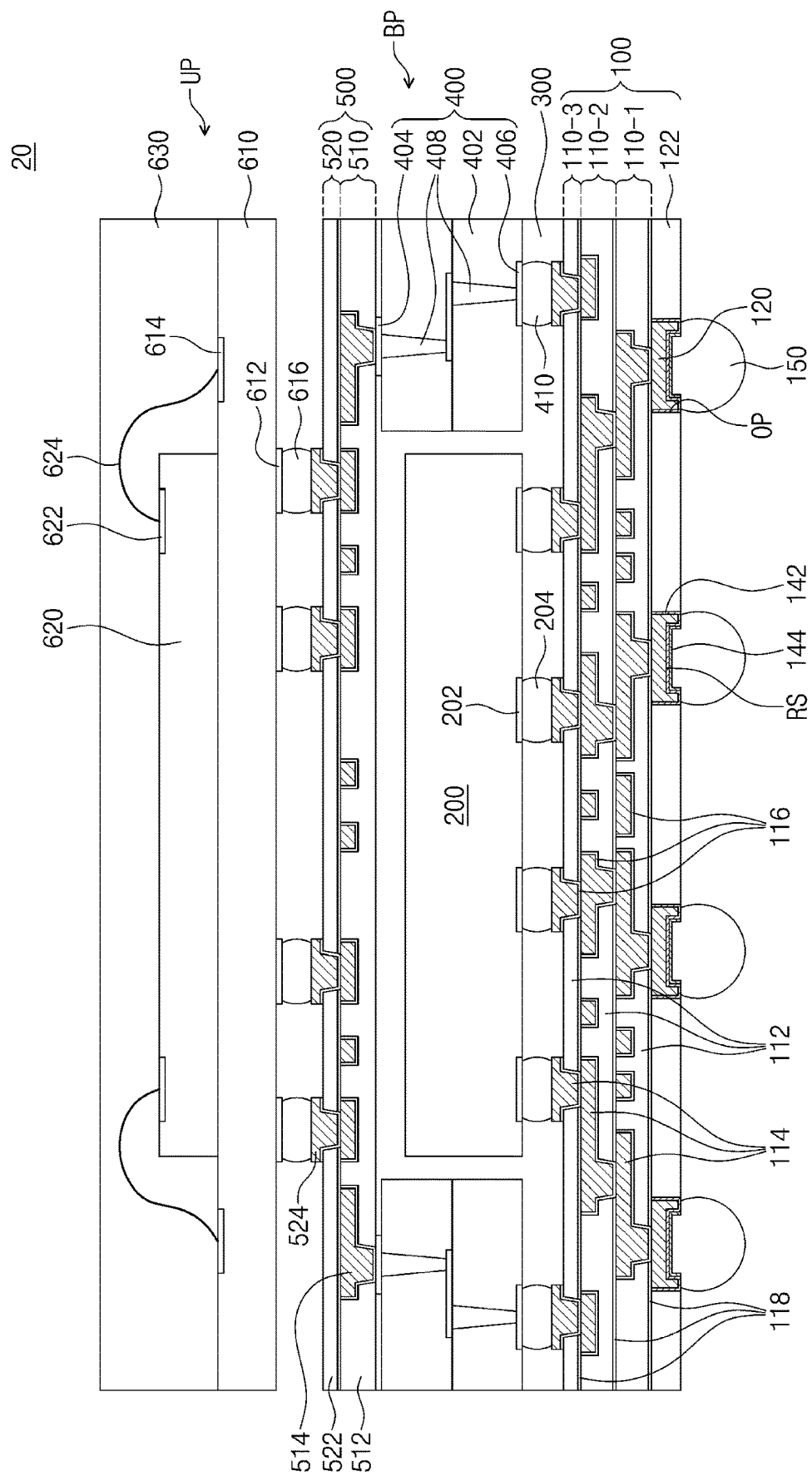

FIG. 10 illustrates a cross-sectional view showing a semiconductor package according to some example embodiments of the present inventive concepts.

Referring to FIG. 10, a semiconductor package 20 may include a lower package BP and an upper package UP. For example, the semiconductor package 20 may be a package-on-package (PoP) in which the upper package UP is mounted on the lower package BP.

The lower package BP may be similar to the semiconductor package 10 discussed with reference to FIG. 9. For example, the lower package BP may include a lower redistribution substrate 100, a first semiconductor chip 200 mounted on the lower redistribution substrate 100, and a first molding member 300 lying/formed on the lower redistribution substrate 100 and covering the first semiconductor chip 200.

In addition, the lower package BP may further include a connection substrate 400 and an upper redistribution substrate 500.

The connection substrate 400 may have an opening that penetrates therethrough. For example, the opening may be shaped like an open hole that connects top and bottom surfaces of the connection substrate 400. The bottom surface of the connection substrate 400 may be spaced apart from a top surface of the lower redistribution substrate 100. The connection substrate 400 may include a base layer 402 and a conductive member as a wiring pattern provided in the base layer 402. For example, the base layer 402 may include or may be formed of silicon oxide. The conductive member may be disposed closer than the opening to an outer portion of the connection substrate 400. The conductive member may include upper pads 404, lower pads 406, and vias 408. The lower pads 406 may be disposed on a lower portion, e.g., on a bottom surface, of the connection substrate 400. The vias 408 may penetrate the base layer 402, and may electrically connect the lower pads 406 to the upper pads 404. For example, the connection substrate 400 may be formed of multiple base layers 402. In this case, each of the base layers 402 may be provided with vias 408, and a connection wire may be formed between the base layers to electrically connect vias respectively formed in different base layers 402 as shown in FIG. 10.

The connection substrate 400 may be mounted on the lower redistribution substrate 100. For example, the connection substrate 400 may be connected to the lower wiring patterns 114 of the uppermost redistribution layer 110-3 through connection substrate terminals 410 provided on the lower pads 406. Therefore, the connection substrate 400 may be electrically connected to the first semiconductor chip 200 and the external terminals 150.

The first semiconductor chip 200 may be disposed on the lower redistribution substrate 100. The first semiconductor chip 200 may be disposed in the opening of the connection substrate 400. For example, the first semiconductor chip 200 may be coupled to the lower wiring patterns 114 of the uppermost redistribution layer 110-3 through connection terminals 204 provided on the chip pads 202.

The upper redistribution substrate 500 may be disposed on a top surface of the first molding member 300 and the top surface of the connection substrate 400. The upper redistribution substrate 500 may include a first upper redistribution layer 510 and a second upper redistribution layer 520 that are stacked on each other. The first and second upper redistribution layers 510 and 520 may be configured similarly to the redistribution layers 110-1, 110-2, and 110-3 of the lower redistribution substrate 100. For example, the first upper redistribution layer 510 may include a first upper dielectric layer 512 and one or more first upper wiring patterns 514 in the first upper dielectric layer 512, and the second upper redistribution layer 520 may include a second upper dielectric layer 522 provided on the first upper dielectric layer 512 and one or more second upper wiring patterns 524 in the second upper dielectric layer 522.

The upper redistribution substrate 500 may be coupled to the connection substrate 400. For example, the first upper wiring patterns 514 of the upper redistribution substrate 500 may be coupled to the upper pads 404 of the connection substrate 400. For example, the first upper wiring patterns 514 of the upper redistribution substrate 500 may contact the upper pads 404 of the connection substrate 400.

The upper package UP may be mounted on the lower package BP. The upper package UP may include an upper package substrate 610, a second semiconductor chip 620, and a second molding member 630. The upper package substrate 610 may be a printed circuit board (PCB). Alternatively, the upper package substrate 610 may be a redistribution substrate. For example, the upper package UP may be the same semiconductor package 10 as the one discussed with reference to FIG. 9. A first upper substrate pad 612 may be disposed on a bottom surface of the upper package substrate 610.

The second semiconductor chip 620 may be disposed on the upper package substrate 610. The second semiconductor chip 620 may include integrated circuits, and the integrated circuits may include a memory circuit, a logic circuit, or a combination thereof. The second semiconductor chip 620 may be of a different type from the first semiconductor chip 200. The second semiconductor chip 620 may have an upper chip pad 622 electrically connected through a bonding wire 624 to a second upper substrate pad 614 of the upper package substrate 610. FIG. 10 depicts that the second semiconductor chip 620 is mounted on the upper package substrate 610 in a wire bonding manner, but the second semiconductor chip 620 may be mounted in various ways, e.g., a flip chip mounting, etc.

The upper package substrate 610 may be provided thereon with the second molding member 630 that covers the second semiconductor chip 620. The second molding member 630 may include or may be formed of a dielectric polymer, such as an epoxy-based polymer.

A conductive terminal 616 may be disposed between the lower package BP and the upper package UP. The conductive terminal 616 may be interposed between and electrically connected to the first upper substrate pad 612 and the second upper wiring pattern 524. Therefore, the upper package UP may be electrically connected to the first semiconductor chip 200 and the external terminal 150 through the conductive terminal 616, the upper redistribution substrate 500, and the connection substrate 400.

Figure 11:
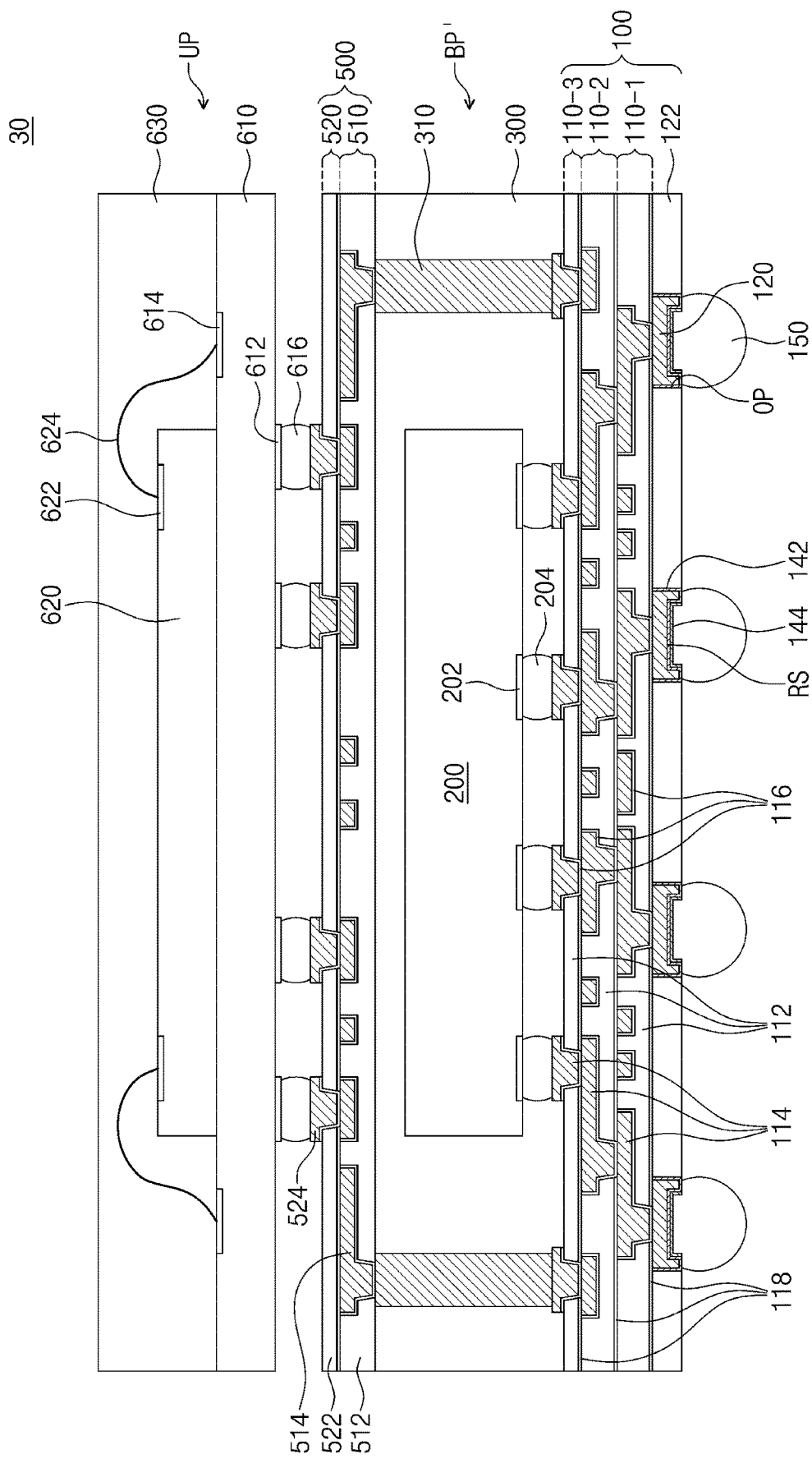

FIG. 11 illustrates a cross-sectional view showing a semiconductor package according to some example embodiments of the present inventive concepts.

Referring to FIG. 11, a semiconductor package 30 may include a lower package BP' and an upper package UP. For example, the semiconductor package 30 may be a package-on-package (PoP) in which the upper package UP is mounted on the lower package BP'.

Compared to the semiconductor package 20 of FIG. 10, a connection substrate 400 may not be included in the lower package BP'. The lower package BP' may include a conductive via 310. The conductive via 310 may be laterally spaced apart from the first semiconductor chip 200. The conductive via 310 may vertically penetrate the first molding member 300. The conductive via 310 may be coupled to a lower wiring pattern 114 of an uppermost redistribution layer 110-3 included in a lower redistribution substrate 100. The conductive via 310 may be electrically connected through the lower redistribution substrate 100 to an external terminal 150 or a first semiconductor chip 200. The conductive via 310 may be coupled to a first upper wiring pattern 514 of an upper redistribution substrate 500. The conductive via 310 may include a metal pillar.

Figure 12:
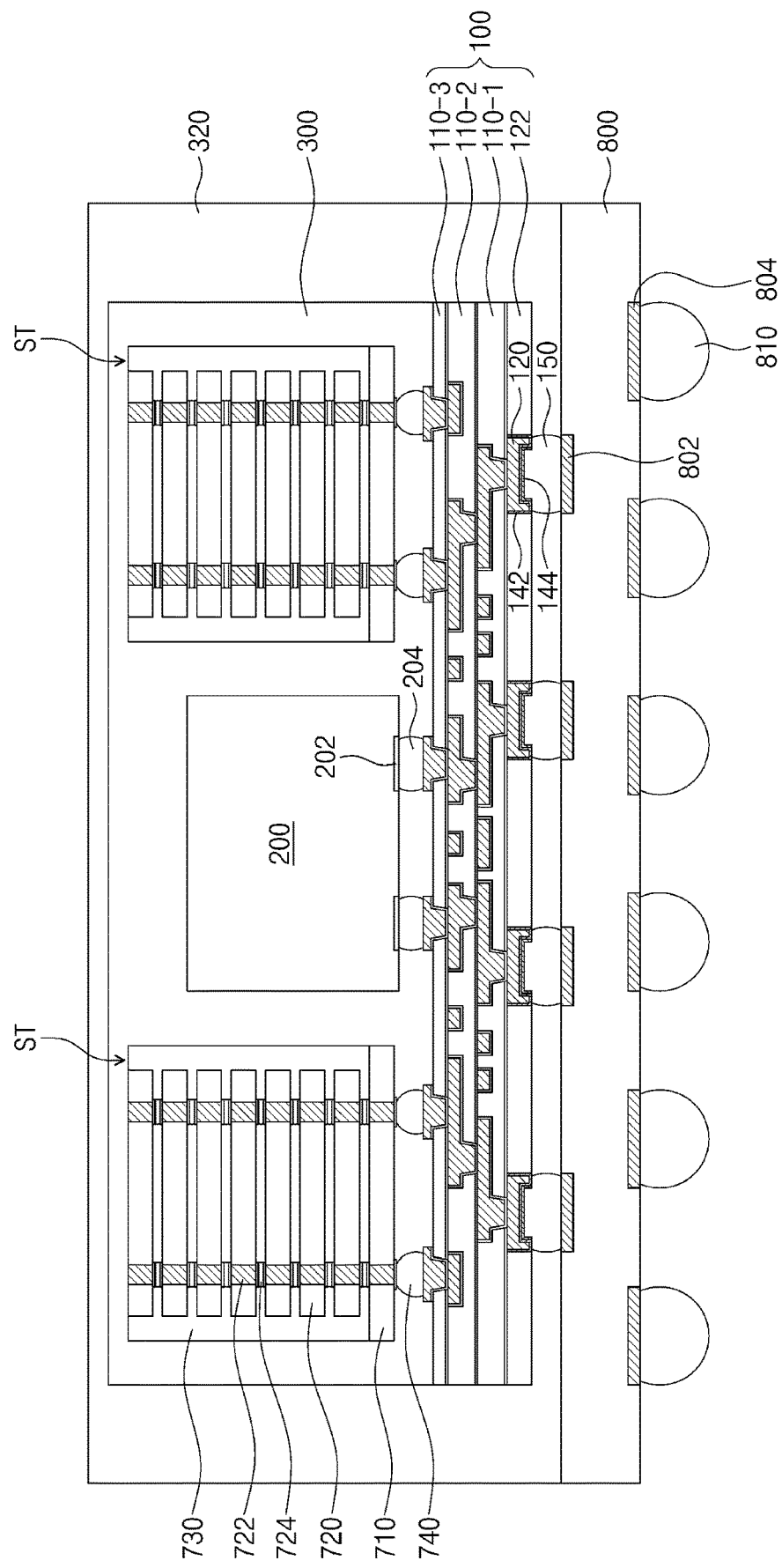

FIG. 12 illustrates a cross-sectional view showing a semiconductor package according to some example embodiments of the present inventive concepts.

Referring to FIG. 12, a semiconductor package may include a package substrate 800, a redistribution substrate 100, a first semiconductor chip 200, and chip stacks ST. In the present embodiment, the redistribution substrate 100 may serve as an interposer and may be called a redistribution interposer.

The redistribution interposer 100 may be the same as or similar to one of the interconnection structures discussed with reference to FIGS. 1 to 8. The redistribution interposer 100 may include redistribution layers 110-1, 110-2, and 110-3 and substrate pads 120 provided below the redistribution layers 110-1, 110-2, and 110-3.

Each of the redistribution layers 110-1, 110-2, and 110-3 may include a lower dielectric layer and a lower wiring pattern formed in the lower dielectric layer.

A substrate pad dielectric layer 122 may be provided on a bottom surface of a lowermost redistribution layer 110-1. The substrate pad dielectric layer 122 may cover the lowermost redistribution layer 110-1. The substrate pad dielectric layer 122 may have openings. The openings may vertically penetrate the substrate pad dielectric layer 122 and may each expose the lower wiring pattern of the lowermost redistribution layer 110-1.

The substrate pad dielectric layer 122 may have substrate pads 120 therein. The substrate pads 120 may be disposed in the openings of the substrate pad dielectric layer 122. The substrate pads 120 may have their shapes that extend along inner lateral and bottom surfaces of the openings. For example, the substrate pads 120 may fill the openings, and may be provided on their bottom surfaces with recess regions that are recessed toward the redistribution layers 110-1, 110-2, and 110-3 from the bottom surfaces of the substrate pads 120. For example, the recess regions of the substrate pads 120 may be central areas of respective substrate pads 120 in a plan view.

A first seed layer 142 may be interposed between the substrate pad 120 and the substrate pad dielectric layer 122. For example, the first seed layer 142 may be in contact with the inner lateral surface of the opening formed in the substrate pad dielectric layer 122 and with an outer lateral surface of the substrate pad 120. The first seed layer 142 may conformally cover the outer lateral surface, the bottom surface, and an inner lateral surface of the substrate pad 120. The first seed layer 142 may have a lowermost surface coplanar with a bottom surface of the substrate pad dielectric layer 122.

A second seed layer 144 may be provided on the substrate pad 120. In the recess region, the second seed layer 144 may be formed to conformally cover the inner lateral surface and the bottom surface of the substrate pad 120. For example, the second seed layer 144 may be formed to conformally cover the inner lateral surface and the bottom of the recess region of the substrate pad 120 on which the first seed layer is formed. For example, the first seed layer 142 may be interposed between the substrate pad 120 and the second seed layer 144 on the inner lateral surface and the bottom of the recess region of the substrate pad 120 as shown in FIG. 12.

External terminals 150 (referred to hereinafter as interposer terminals) may be provided on the substrate pads 120. The interposer terminals 150 may be in contact with the second seed layers 144.

A first semiconductor chip 200 may be mounted on the redistribution interposer 100. The first semiconductor chip 200 may be flip-chip mounted on the redistribution interposer 100. For example, the first semiconductor chip 200 may be mounted on the redistribution interposer 100 through connection terminals 204 provided on chip pads 202 of the first semiconductor chip 200. The first semiconductor chip 200 may be, for example, a logic chip.

The chip stacks ST may be provided on the redistribution interposer 100. Each of the chip stacks ST may include a plurality of second semiconductor chips 720 that are stacked in a vertical direction on a base chip 710. An adhesive layer, such as a non-conductive film (NCF), may be provided between the second semiconductor chips 720 and between the base chip 710 and the second semiconductor chips 720.

The base chip 710 and the second semiconductor chips 720 may each have through vias 722 that penetrate therethrough. Neighboring second semiconductor chips 720 may be connected to each other through conductive pads electrically connected to their through vias 722 and bumps 724 between the conductive pads. The second semiconductor chips 720 may be memory chips.

Each of the chip stacks ST may further include, on the base chip 710, a chip stack molding layer 730 that covers the second semiconductor chips 720.

The chip stacks ST may be mounted on the redistribution interposer 100. For example, each of the chip stacks ST may be electrically connected through chip stack terminals 740 provided below the base chip 710 to a lower wiring pattern of an uppermost redistribution layer 110-3 included in the redistribution interposer 100. Therefore, the chip stacks ST may be electrically connected to the first semiconductor chip 200 and/or the interposer terminals 150.

A first molding member 300 may be provided on the redistribution interposer 100. The first molding member 300 may cover the first semiconductor chip 200 and the chip stacks ST. The first molding member 300 may include or may be formed of a dielectric material, such as an epoxy molding compound (EMC).

The redistribution interposer 100 may be mounted on a package substrate 800. The package substrate 800 may have first pads 802 provided on a top surface of the package substrate 800. The interposer terminals 150 of the redistribution interposer 100 may be electrically coupled to the first pads 802 of the package substrate 800. For example, the interposer terminals 150 of the redistribution interposer 100 may contact the first pads 802 of the package substrate 800. The package substrate 800 may have second pads 804 provided on a bottom surface of the package substrate 800. The second pads 804 may be provided thereon with external terminals 810. The package substrate 800 may have wiring lines therein, and the first pads 802 may be electrically connected through the wiring lines to the second pads 804. The external terminals 810 may be mounted on an external substrate, such as a motherboard. For example, the external terminals 810 may be electrically connected to a circuit formed in the motherboard.

A second molding member 320 may be provided on the package substrate 800. The second molding member 320 may cover top and lateral surfaces of the first molding member 300 and a lateral surface of the redistribution interposer 100. The second molding member 320 may encapsulate the interposer terminals 150.

FIGS. 13 to 23 illustrate cross-sectional views showing a method of fabricating an interconnection structure according to some example embodiments of the present inventive concepts.

Figure 13:
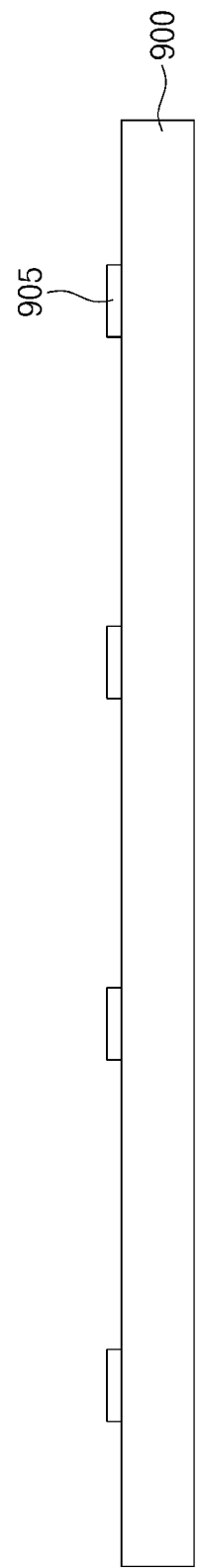
FIGS. 13 to 23 illustrate cross-sectional views showing a method of fabricating an interconnection structure according to some example embodiments of the present inventive concepts.

Referring to FIG. 13, a first carrier substrate 900 may be provided. The first carrier substrate 900 may be a dielectric substrate including or formed of glass or a polymer, or may be a conductive substrate including or formed of a metal. The first carrier substrate 900 may be provided with an adhesive member on a top surface of the first carrier substrate 900. For example, the adhesive member may include or may be a glue tape.

Sacrificial patterns 905 may be formed on the first carrier substrate 900. For example, the sacrificial patterns 905 may be formed by depositing a photosensitive material on the first carrier substrate 900, and then performing exposure and development processes on the photosensitive material. The sacrificial patterns 905 may have their circular shapes when viewed in a plan view. The sacrificial patterns 905 may have their tetragonal cross-sections. No limitation, however, is imposed on the shapes of the sacrificial patterns 905.

Figure 14:
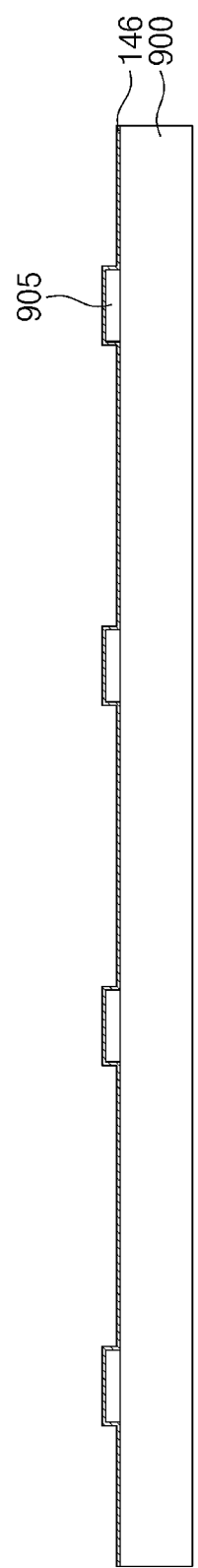

Referring to FIG. 14, a first preliminary seed layer 146 may be formed on the first carrier substrate 900. The first preliminary seed layer 146 may be formed to conformally cover the sacrificial patterns 905 and the top surface of the first carrier substrate 900. The first preliminary seed layer 146 may have a thickness of about 0.1 μm to about 1 μm. The first preliminary seed layer 146 may include or may be formed of a metallic material that has a high wettability with an external terminal 150 which will be discussed below. For example, the first preliminary seed layer 146 may include or may be formed of copper (Cu), ruthenium (Ru), nickel (Ni), titanium (Ti), or tungsten (W).

Figure 15:
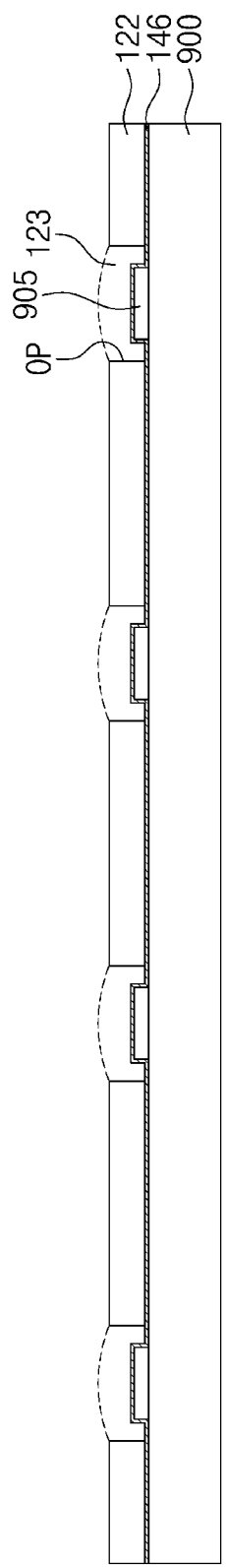

Referring to FIG. 15, a preliminary dielectric layer 123 may be formed on the first carrier substrate 900. The preliminary dielectric layer 123 may be formed to lie on the first preliminary seed layer 146 and to cover the sacrificial patterns 905. Therefore, the preliminary dielectric layer 123 may have a top surface that has protrusions on the sacrificial pattern 905. The preliminary dielectric layer 123 may include or may be formed of a photosensitive polymer or a photo-imageable dielectric (PID). The photosensitive polymer may include, for example, one or more of photosensitive polyimide, polybenzoxazole (PBO), phenolic polymers, and benzocyclobutene polymers.

The preliminary dielectric layer 123 may be patterned to form a first dielectric layer 122. For example, openings OP may be formed in the preliminary dielectric layer 123, thereby exposing the first preliminary seed layer 146. The preliminary dielectric layer 123 may be patterned by an exposure and a development processes. The exposure process may be a negative tone exposure process or a positive tone exposure process. Afterwards, a cure process may be performed on the preliminary dielectric layer 123. The openings OP may be formed on/above the sacrificial patterns 905. For example, when viewed in a plan view, the sacrificial patterns 905 may be positioned inside the openings OP. The sacrificial patterns 905 may be spaced apart from inner sidewalls of the openings OP.

Figure 16:
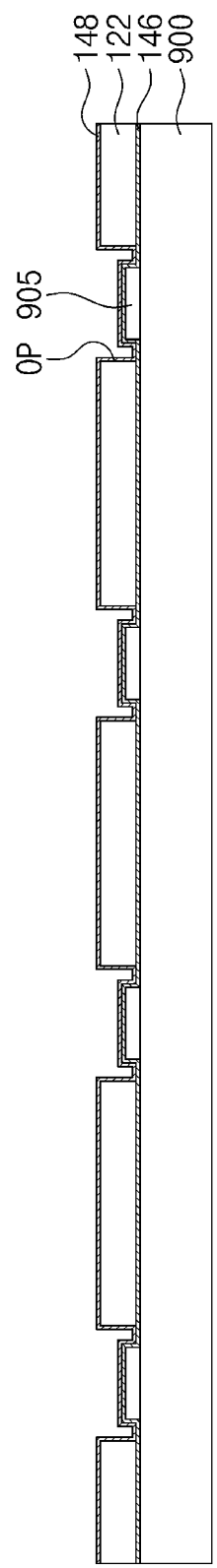

Referring to FIG. 16, a second preliminary seed layer 148 may be formed on the first dielectric layer 122. The second preliminary seed layer 148 may be formed to cover a top surface of the first dielectric layer 122, inner lateral surfaces of the openings OP, and a top surface of the first preliminary seed layer 146 exposed to the openings OP. The second preliminary seed layer 148 may have a thickness of about 0.1 μm to about 1 μm. The second preliminary seed layer 148 may include or may be formed of titanium (Ti), titanium nitride (TiN), tantalum (Ta), tantalum nitride (TaN), nickel (Ni), or tungsten nitride (TW).

Figure 17:
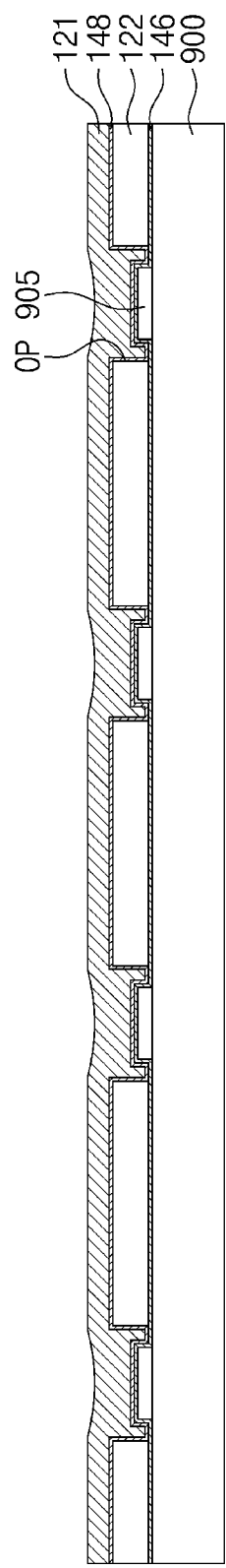

Referring to FIG. 17, a conductive layer 121 may be formed on the first dielectric layer 122. The conductive layer 121 may be formed on the second preliminary seed layer 148, thereby filling the openings OP and covering the top surface of the first dielectric layer 122. The conductive layer 121 may be formed by performing a plating process in which the second preliminary seed layer 148 is used as a seed. The conductive layer 121 may include or may be formed of a metal, such as copper (Cu).

Figure 18:
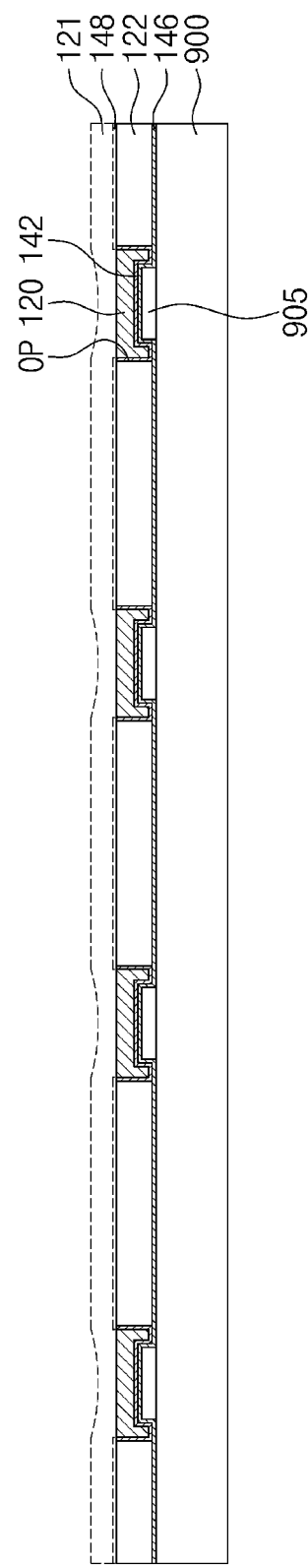

Referring to FIG. 18, the second preliminary seed layer 148 and the conductive layer 121 may undergo a planarization process to form first seed layers 142 and substrate pads 120. The planarization process may include or may be, for example, a chemical mechanical polishing (CMP) process. The planarization process may continue until the top surface of the first dielectric layer 122 is exposed. For example, the first seed layers 142 may be formed by selectively removing the second preliminary seed layer 148 from the top surface of the first dielectric layer 122, and the substrate pads 120 remaining in the openings OP may be formed by selectively removing the conductive layer 121 located at a higher level than that of the top surface of the first dielectric layer 122.

Figure 19:
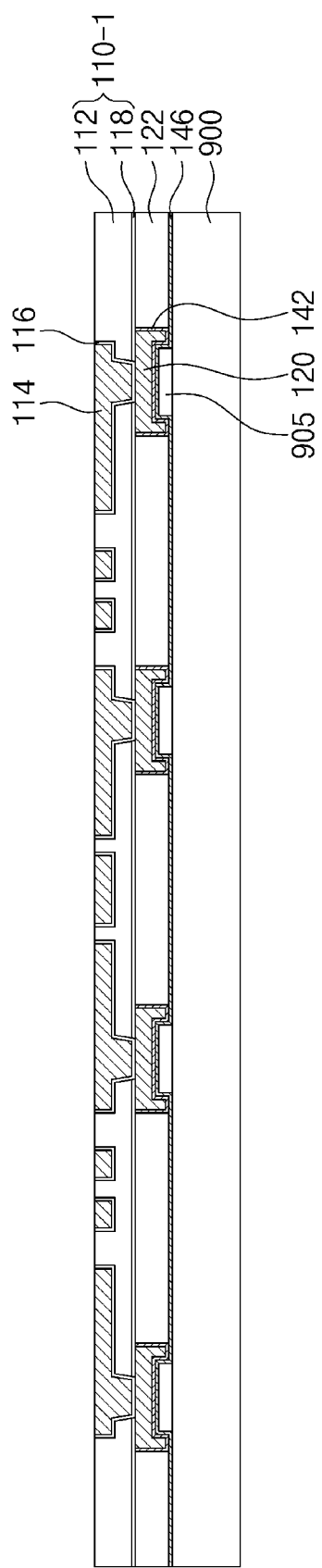

Referring to FIG. 19, a first redistribution layer 110-1 may be formed on the first dielectric layer 122. The first redistribution layer 110-1 may be formed by forming a passivation layer 118 on the first dielectric layer 122, forming a second dielectric layer 112 on the passivation layer 118, forming openings that penetrate the second dielectric layer 112 and the passivation layer 118 to expose the substrate pads 120, and forming a first barrier layer 116 and a first wiring pattern 114 in each of the openings. The passivation layer 118 may be formed by performing a deposition process in which a dielectric material is deposited on the first dielectric layer 122. The deposition process may include or may be a chemical vapor deposition (CVD) process. The second dielectric layer 112 may be formed by a coating process such as spin coating or slit coating. The second dielectric layer 112 may include or may be formed of a photosensitive polymer or a photo-imageable dielectric (PID). For example, the photosensitive polymer may include one or more of photosensitive polyimide, polybenzoxazole (PBO), phenolic polymers, and benzocyclobutene polymers. The first barrier layers 116 and the first wiring patterns 114 may be formed by forming a preliminary barrier layer and a conductive layer to fill the openings, and then performing a planarization process on the preliminary barrier layer and the conductive layer.

Figure 20:
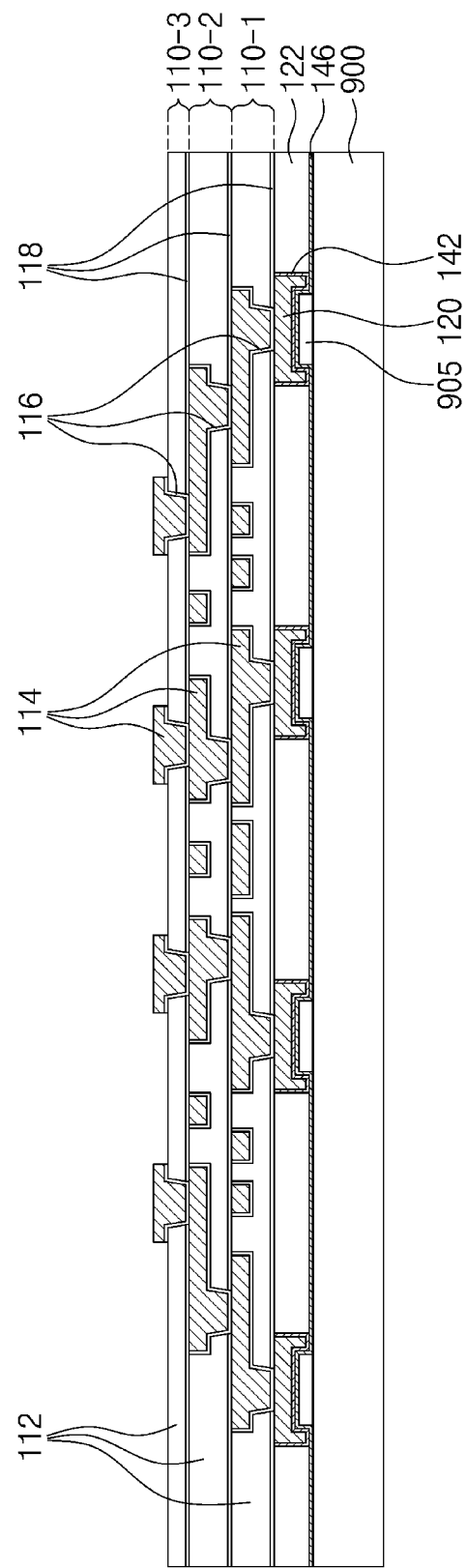

Referring to FIG. 20, second and third redistribution layers 110-2 and 110-3 may be formed on the first redistribution layer 110-1. The formation of the second and third redistribution layers 110-2 and 110-3 may be the same as or similar to that of the first redistribution layer 110-1.

Figure 21:
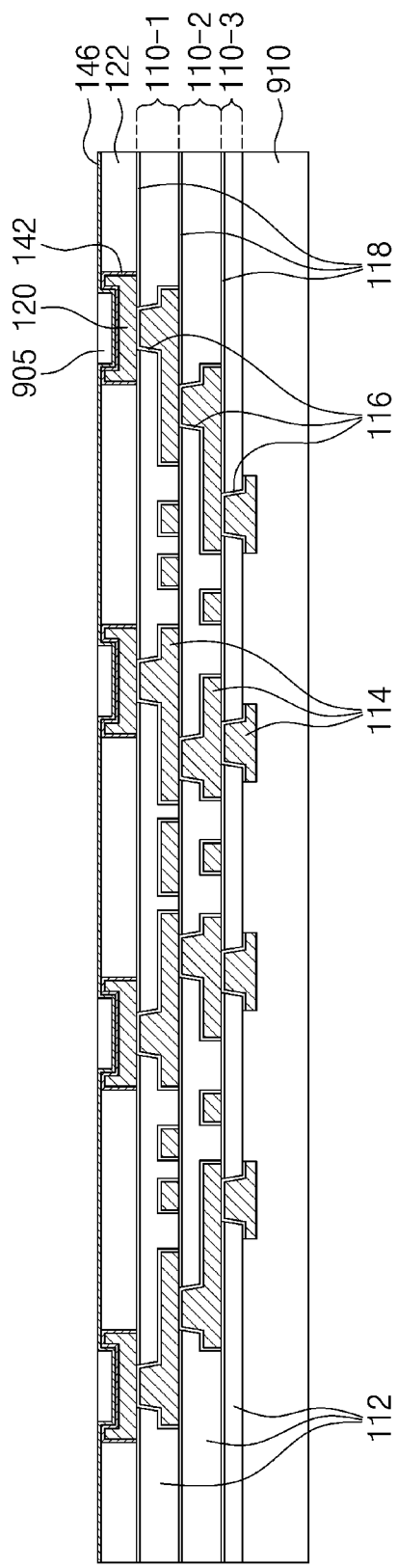

Referring to FIG. 21, a second carrier substrate 910 may be attached to the third redistribution layer 110-3. The second carrier substrate 910 may be a dielectric substrate including or made of glass or polymer, or may be a conductive substrate including or made of metal. The second carrier substrate 910 may be attached to the third redistribution layer 110-3 through an adhesive member provided on a top surface of the second carrier substrate 910. For example, the adhesive member may include or may be a glue tape.

Afterwards, a resultant structure including the first and second carrier substrates 900 and 910 may be turned upside down. For example, the resultant structure may be turned upside down to be in a position at which the third redistribution layer 110-3, the second redistribution layer 110-2, and the first redistribution layer 110-1 are sequentially stacked on the second carrier substrate 910.

The first carrier substrate 900 may be removed. The removal of the first carrier substrate 900 may expose the first preliminary seed layer 146. In this stage, top surfaces of the sacrificial patterns 905 may also be exposed.

Figure 22:
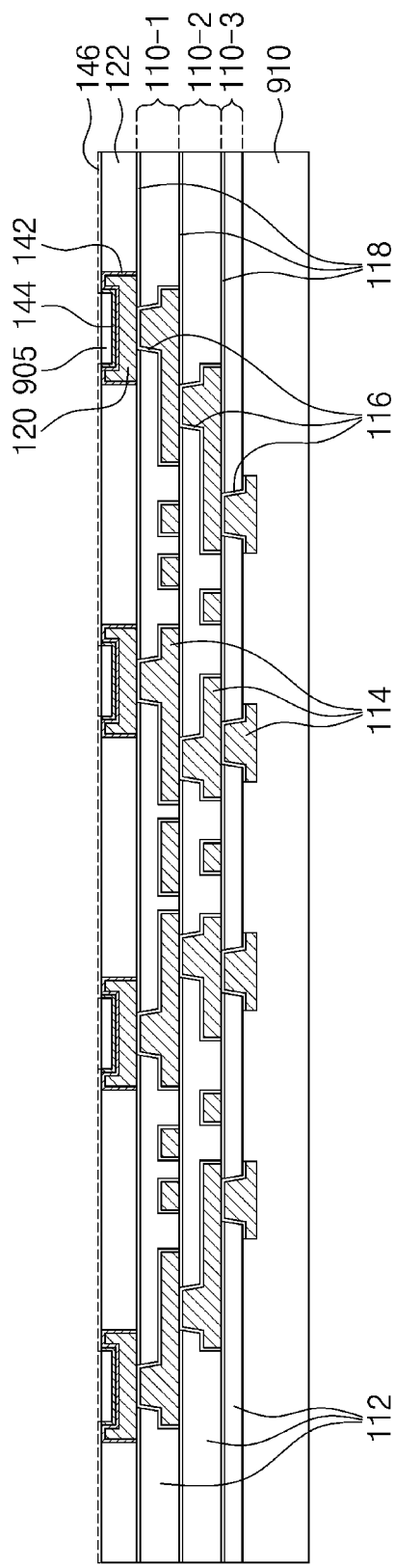

Referring to FIG. 22, the first preliminary seed layer 146 may undergo a planarization process to form second seed layers 144. The planarization process may include or may be, for example, a chemical mechanical polishing (CMP) process. The planarization process may continue until the top surface of the first dielectric layer 122 is exposed. For example, the second seed layers 144 may be formed by selectively removing the first preliminary seed layer 146 from the top surface of the first dielectric layer 122. The first seed layers 142 may be exposed by selectively removing the first preliminary seed layer 146 from sidewall parts (see 126 of FIG. 2) of the substrate pads 120. When the planarization process is performed, the sacrificial patterns 905 may be partially removed. Therefore, the top surface of the first dielectric layer 122 may be coplanar with uppermost surfaces of the first seed layers 142, uppermost ends of the second seed layers 144, and the top surfaces of the sacrificial patterns 905.

Figure 23:
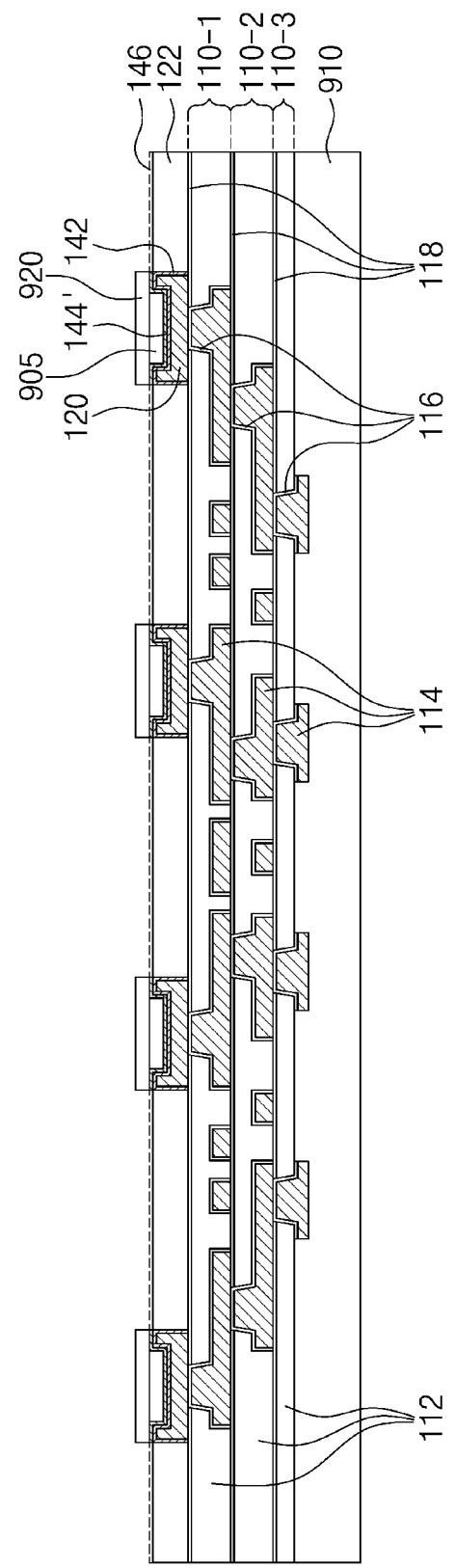

Alternatively, the first preliminary seed layer 146 may not be removed from sidewall parts (see 126 of FIG. 2) of the substrate pads 120. As shown in FIG. 23, mask patterns 920 may be formed on the substrate pads 120. The mask patterns 920 may cover the substrate pads 120 and may expose the top surface of the first dielectric layer 122. An etching process may be performed in which the mask patterns 920 are used as an etching mask to selectively remove the first preliminary seed layer 146 from the top surface of the first dielectric layer 122, thereby forming second seed layers 144'. Therefore, the first seed layer 142 may not be exposed. In this case, there may be fabricated an interconnection structure discussed with reference to FIGS. 4 and 5. The following will focus on the embodiment of FIG. 22.

Referring back to FIG. 1, the sacrificial patterns 905 may be removed. The removal of the sacrificial patterns 905 may entirely expose the second seed layers 144 formed on recess regions of the substrate pads 120. External terminals 150 may be provided on the exposed second seed layers 144.

Thereafter, the second carrier substrate 910 may be removed.

By the process mentioned above, an interconnection structure 100 shown in FIG. 1 may be fabricated.

FIGS. 24 to 28 illustrate cross-sectional views showing a method of fabricating an interconnection structure according to some example embodiments of the present inventive concepts.

Figure 24:
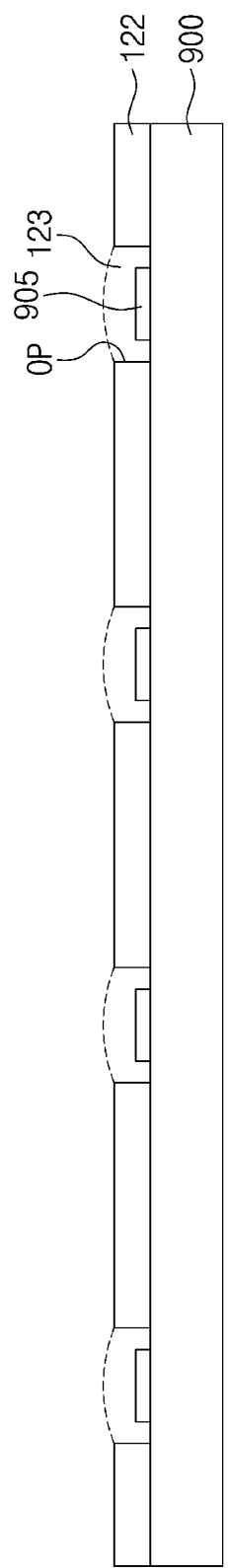
FIGS. 24 to 28 illustrate cross-sectional views showing a method of fabricating an interconnection structure according to some example embodiments of the present inventive concepts.

Referring to FIG. 24, a first carrier substrate 900 may be provided. The first carrier substrate 900 may be a dielectric substrate including or formed of glass or a polymer, or may be a conductive substrate including or formed of a metal. The first carrier substrate 900 may be provided with an adhesive member on a top surface of the first carrier substrate 900. For example, the adhesive member may include or may be a glue tape.

Sacrificial patterns 905 may be formed on the first carrier substrate 900. For example, the sacrificial patterns 905 may be formed by depositing a photosensitive material on the first carrier substrate 900, and then performing an exposure and a development processes on the photosensitive material. The sacrificial patterns 905 may have their circular shapes when viewed in a plan view. The sacrificial patterns 905 may have their tetragonal cross-sections.

A preliminary dielectric layer 123 may be formed on the first carrier substrate 900. The preliminary dielectric layer 123 may be formed to lie on the first carrier substrate 900 and to cover the sacrificial patterns 905. Therefore, the preliminary dielectric layer 123 may have a top surface that has protrusions on/above the sacrificial patterns 905. The preliminary dielectric layer 123 may include or may be formed of a photosensitive polymer or a photo-imageable dielectric (PID). The photosensitive polymer may include, for example, one or more of photosensitive polyimide, polybenzoxazole (PBO), phenolic polymers, and benzocyclobutene polymers.

The preliminary dielectric layer 123 may be patterned to form a first dielectric layer 122. For example, openings OP may be formed in the preliminary dielectric layer 123, thereby exposing the sacrificial patterns 905. The preliminary dielectric layer 123 may be patterned by an exposure and a development processes. The exposure process may be a negative tone exposure process or a positive tone exposure process. Afterwards, a cure process may be performed on the preliminary dielectric layer 123. The openings OP may be formed on the sacrificial patterns 905. For example, when viewed in a plan view, the sacrificial patterns 905 may be positioned inside the openings OP. The sacrificial patterns 905 may be spaced apart from inner sidewalls of the openings OP.

Figure 25:
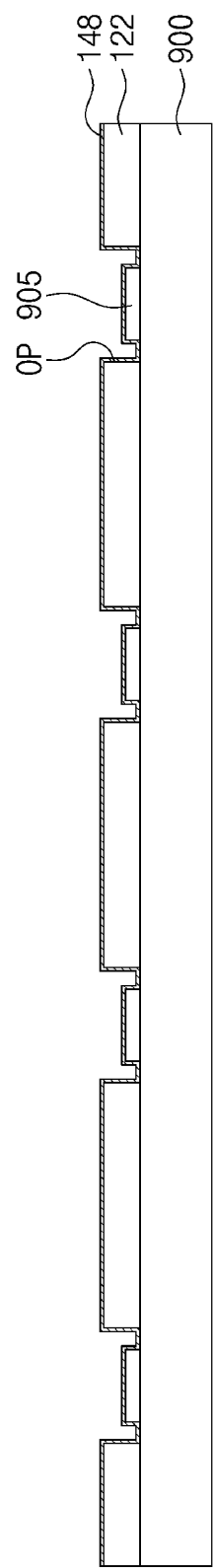

Referring to FIG. 25, a second preliminary seed layer 148 may be formed on the first dielectric layer 122. The second preliminary seed layer 148 may be formed to conformally cover a top surface of the first dielectric layer 122, inner lateral surfaces of the openings OP, and the sacrificial patterns 905 exposed to the openings OP. The second preliminary seed layer 148 may have a thickness of about 0.1 μm to about 1 μm. The second preliminary seed layer 148 may include or may be formed of ruthenium (Ru), nickel (Ni), titanium (Ti), or tungsten (W).

Figure 26:
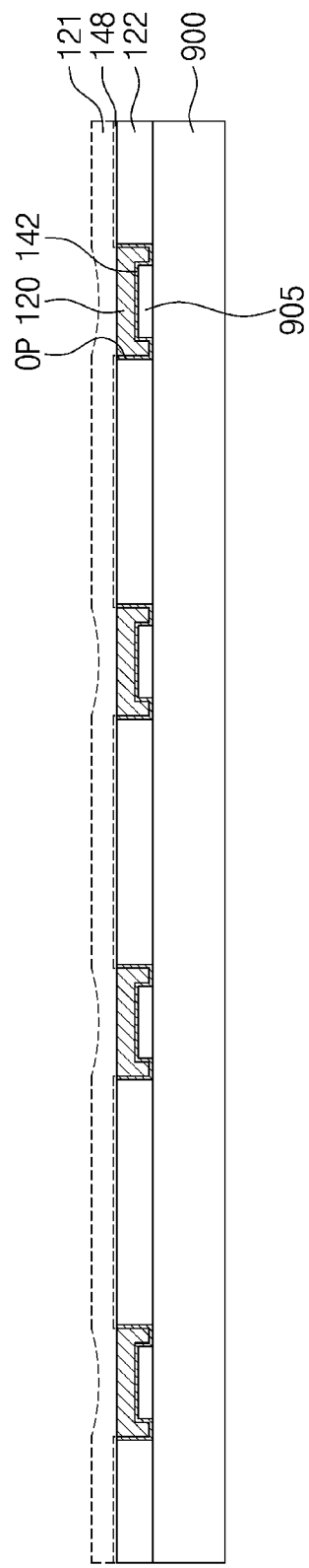

Referring to FIG. 26, a conductive layer 121 may be formed on the first dielectric layer 122. The conductive layer 121 may be formed on the second preliminary seed layer 148, thereby filling the openings OP and covering the top surface of the first dielectric layer 122. The conductive layer 121 may be formed by performing a plating process in which the second preliminary seed layer 148 is used as a seed. The conductive layer 121 may include or may be formed of a metal, such as copper (Cu).

The second preliminary seed layer 148 and the conductive layer 121 may undergo a planarization process to form first seed layers 142 and substrate pads 120. The planarization process may include or may be, for example, a chemical mechanical polishing (CMP) process. The planarization process may continue until the top surface of the first dielectric layer 122 is exposed. For example, the first seed layers 142 may be formed by selectively removing the second preliminary seed layer 148 from the top surface of the first dielectric layer 122, and the substrate pads 120 remaining in the openings OP may be formed by selectively removing the conductive layer 121 located at a higher level than that of the top surface of the first dielectric layer 122.

Figure 27:
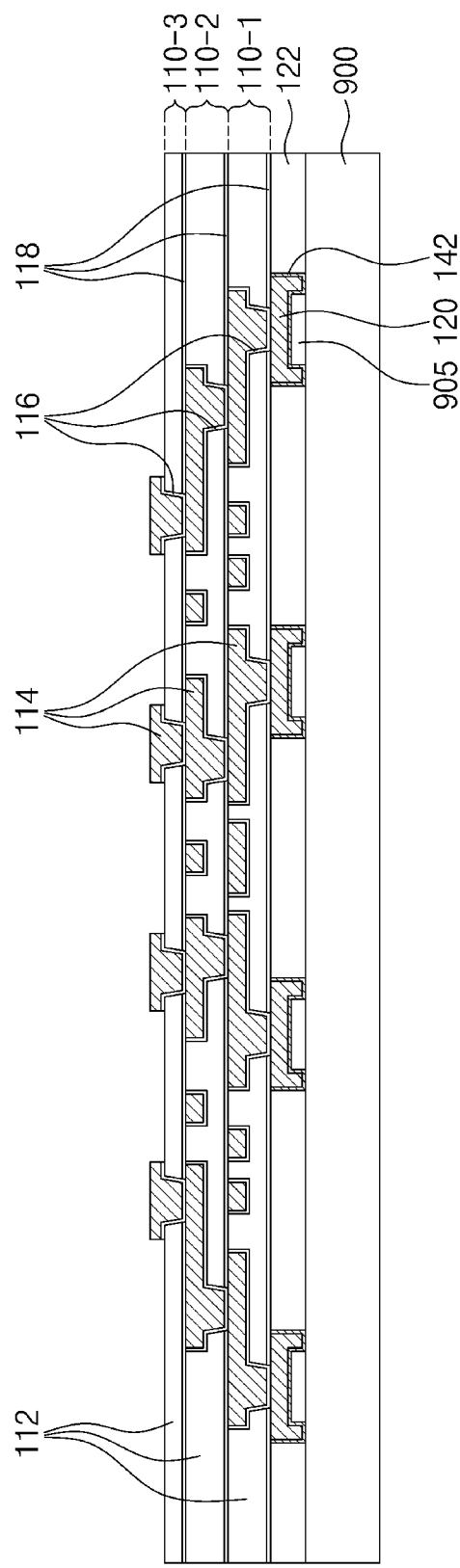

Referring to FIG. 27, first, second, and third redistribution layers 110-1, 110-2, and 110-3 may be formed on the first dielectric layer 122. The formation of the first, second, and third redistribution layers 110-1, 110-2, and 110-3 may be the same as that discussed with reference to FIGS. 19 and 20.

Figure 28:
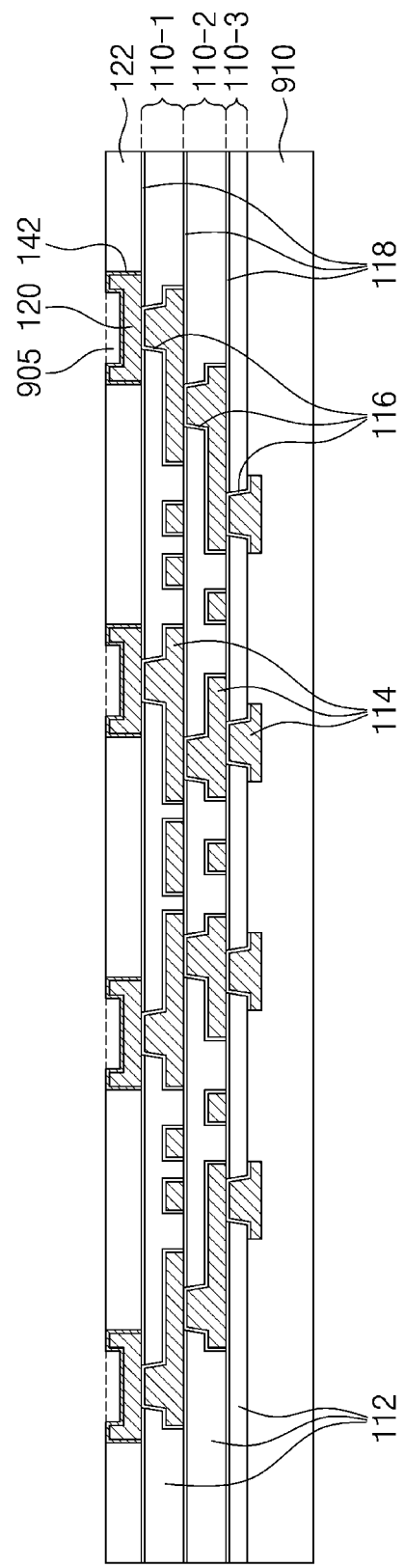

Referring to FIG. 28, a second carrier substrate 910 may be attached to the third redistribution layer 110-3. The second carrier substrate 910 may be a dielectric substrate including or formed of glass or a polymer, or may be a conductive substrate including or formed of a metal. The second carrier substrate 910 may be attached to the third redistribution layer 110-3 through an adhesive member provided on a top surface of the second carrier substrate 910.

Afterwards, a resultant structure including the first and second carrier substrates 900 and 910 may be turned upside down. For example, the resultant structure may be turned upside down to have a shape in which the third redistribution layer 110-3, the second redistribution layer 110-2, and the first redistribution layer 110-1 are sequentially stacked on the second carrier substrate 910.

The first carrier substrate 900 may be removed. The removal of the first carrier substrate 900 may expose the first seed layers 142. In this stage, top surfaces of the sacrificial patterns 905 may also be exposed.

The sacrificial patterns 905 may be removed. The removal of the sacrificial patterns 905 may expose portions of the first seed layers 142 formed on the recess regions of the substrate pads 120 as shown in FIG. 28.

Referring back to FIG. 6, external terminals 150 may be provided on the exposed first seed layers 142.

Thereafter, the second carrier substrate 910 may be removed.

By a process mentioned above, an interconnection structure 100 may be fabricated as shown in FIG. 6.

According to some example embodiments of the present inventive concepts, an interconnection structure may include a first seed layer that blocks oxygen from being introduced into substrate pads from a third dielectric layer or from outside and prevents the substrate pads from being corroded. An increased contact area and a high adhesive force may be provided between a second seed layer and an external terminal. As the substrate pad is provided thereon with the second seed layer having a high wettability with the external terminal, the external terminal may be rigidly attached to the substrate pad. Accordingly, above described embodiments may be beneficial to provide an interconnection structure with improved structural stability.

Moreover, the second seed layer may be provided to completely cover a top surface of the substrate pad, and the external terminal may be in contact with only the second seed layer. For example, the external terminal may be in contact with only a single material layer. Therefore, surface stress may be alleviated in the interface between the external terminal and the seed layer/substrate pad compared to a case in which the external terminal is in contact with a plurality of material layers at the same time. Accordingly, above disclosed embodiments may be beneficial to provide an interconnection structure with improved structural stability.

Although the present inventive concepts have been described in connection with some example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A method of fabricating an interconnection structure, the method comprising:
    forming a sacrificial pattern on a carrier substrate;
    forming on the carrier substrate a first dielectric layer that has an opening, the sacrificial pattern being in the opening;
    forming on the carrier substrate a first seed layer that conformally covers the sacrificial pattern, a top surface of the first dielectric layer, and an inner lateral surface and a bottom surface of the opening;
    forming on the first seed layer a conductive layer that covers the first dielectric layer and fills the opening;
    performing on the conductive layer a planarization process to form a pad that remains in the opening and to selectively remove the first seed layer from the top surface of the first dielectric layer;
    forming a second dielectric layer on the first dielectric layer; and
    forming a wiring pattern that penetrates the second dielectric layer and is coupled to the pad.

2. The method of claim 1, further comprising, before forming the first dielectric layer, forming on the carrier substrate a second seed layer that conformally covers the sacrificial pattern and a top surface of the carrier substrate,
    wherein, in the opening, the first seed layer is in contact with the second seed layer.

3. The method of claim 2, wherein the second seed layer extends between the sacrificial pattern and the first seed layer.

4. The method of claim 2, wherein, beside the sacrificial pattern, the second seed layer extends between the carrier substrate and the first seed layer.

5. The method of claim 2, further comprising:
    removing the carrier substrate to expose the second seed layer and the sacrificial pattern;
    performing on the second seed layer a planarization process to selectively remove the second seed layer from a bottom surface of the first dielectric layer; and
    removing the sacrificial pattern.

6. The method of claim 5, wherein, after the planarization process, a lowermost end of the second seed layer is located at a level the same as a level of the bottom surface of the first dielectric layer.

7. The method of claim 1, wherein the pad includes:
    a base part on a top surface of the sacrificial pattern; and
    a sidewall part that extends from the base part along a lateral surface of the sacrificial pattern.

8. The method of claim 7, wherein the pad has a U-shaped cross-section.

9. The method of claim 7, wherein a width of the sidewall part is about 5% to about 20% of a width of the opening.

10. The method of claim 1, wherein the first seed layer includes a metallic material whose ionization tendency is greater than an ionization tendency of a metallic material included in the pad.

11. The method of claim 1, further comprising:
    removing the carrier substrate to expose a bottom surface of the first dielectric layer, the first seed layer and the sacrificial pattern; and
    removing the sacrificial pattern.

12. A method of fabricating an interconnection structure, the method comprising:
- forming a sacrificial pattern on a carrier substrate;
- forming on the carrier substrate a first seed layer that conformally covers the sacrificial pattern;
- forming on the carrier substrate a first dielectric layer that has an opening, the sacrificial pattern being in the opening;
- forming on the carrier substrate a second seed layer that conformally covers the first seed layer, and an inner lateral surface of the opening;
- forming on the second seed layer a conductive layer that fills the opening to form a pad;
- forming a second dielectric layer on the first dielectric layer; and
- forming a wiring pattern that penetrates the second dielectric layer and is coupled to the pad.

13. The method of claim 12,
- wherein the second seed layer conformally covers the sacrificial pattern, a top surface of the first dielectric layer, and the inner lateral surface and a bottom surface of the opening,
- wherein the conductive layer covers the first dielectric layer and fills the opening, and
- wherein the method further comprising performing on the conductive layer a planarization process to form the pad that remains in the opening and to selectively remove the second seed layer from the top surface of the first dielectric layer.

14. The method of claim 12, wherein, in the opening, the first seed layer is in contact with the second seed layer.

15. The method of claim 12, wherein, on the sacrificial pattern, the first seed layer extends between the sacrificial pattern and the second seed layer.

16. The method of claim 12, wherein, adjacent to the sacrificial pattern, the first seed layer extends between the carrier substrate and the second seed layer.

17. The method of claim 12, further comprising:
- removing the carrier substrate to expose the first seed layer and the sacrificial pattern;
- performing on the first seed layer a planarization process to selectively remove the first seed layer from a bottom surface of the first dielectric layer; and
- removing the sacrificial pattern.

18. The method of claim 17, wherein, after the planarization process, a lowermost end of the first seed layer is located at a level the same as a level of the bottom surface of the first dielectric layer.

19. The method of claim 12, wherein the pad includes:
- a base part on a top surface of the sacrificial pattern; and
- a sidewall part that extends from the base part along a lateral surface of the sacrificial pattern.

20. The method of claim 19, wherein a width of the sidewall part is about 5% to about 20% of a width of the opening.

* * * * *